(12) United States Patent
Hioka

(10) Patent No.: US 9,633,730 B2
(45) Date of Patent: Apr. 25, 2017

(54) SEMICONDUCTOR MEMORY DEVICE

(71) Applicant: Kabushiki Kaisha Toshiba, Minato-ku (JP)

(72) Inventor: Takeshi Hioka, Machida (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/849,082

(22) Filed: Sep. 9, 2015

(65) Prior Publication Data

US 2016/0267981 A1    Sep. 15, 2016

(30) Foreign Application Priority Data

Mar. 12, 2015 (JP) ................................. 2015-049724

(51) Int. Cl.
| | |
|---|---|
| *G11C 16/10* | (2006.01) |
| *G11C 16/04* | (2006.01) |
| *G11C 16/26* | (2006.01) |
| *G11C 7/06* | (2006.01) |
| *G11C 7/08* | (2006.01) |

(52) U.S. Cl.
CPC .......... *G11C 16/0483* (2013.01); *G11C 7/067* (2013.01); *G11C 7/08* (2013.01); *G11C 16/26* (2013.01)

(58) Field of Classification Search
USPC ........................................ 365/185.17, 185.18
See application file for complete search history.

(56) References Cited

U.S. PATENT DOCUMENTS

| | | | |
|---|---|---|---|
| 2007/0252201 A1 | 11/2007 | Kito et al. | |
| 2009/0091975 A1* | 4/2009 | Lee ................... | G11C 16/0483 365/185.05 |
| 2009/0097314 A1* | 4/2009 | Lee ................... | G11C 11/5628 365/185.03 |
| 2009/0267128 A1 | 10/2009 | Maejima | |
| 2009/0268522 A1 | 10/2009 | Maejima | |
| 2010/0207195 A1 | 8/2010 | Fukuzumi et al. | |
| 2011/0284946 A1 | 11/2011 | Kiyotoshi | |
| 2015/0071000 A1* | 3/2015 | Namai ................. | G11C 7/04 365/185.17 |

FOREIGN PATENT DOCUMENTS

WO    WO 2015/037416 A1    3/2015

* cited by examiner

*Primary Examiner* — Hoai V Ho
*Assistant Examiner* — Minh Dinh
(74) *Attorney, Agent, or Firm* — Oblon, McClelland, Maier & Neustadt, L.L.P.

(57) ABSTRACT

A memory device includes a first string and a second string. The first string includes first and second transistors and first cell transistors coupled in series between a source line and a bit line. The second string includes third and fourth transistors and second cell transistors coupled in series between the source line and the bit line. During a read, a gate of the fourth transistor is applied with a voltage to turn off the transistor, and after start of application of voltages to the first cell transistors, the gate of the fourth transistor is applied with a voltage substantially the same as a voltage applied to the source line.

18 Claims, 27 Drawing Sheets

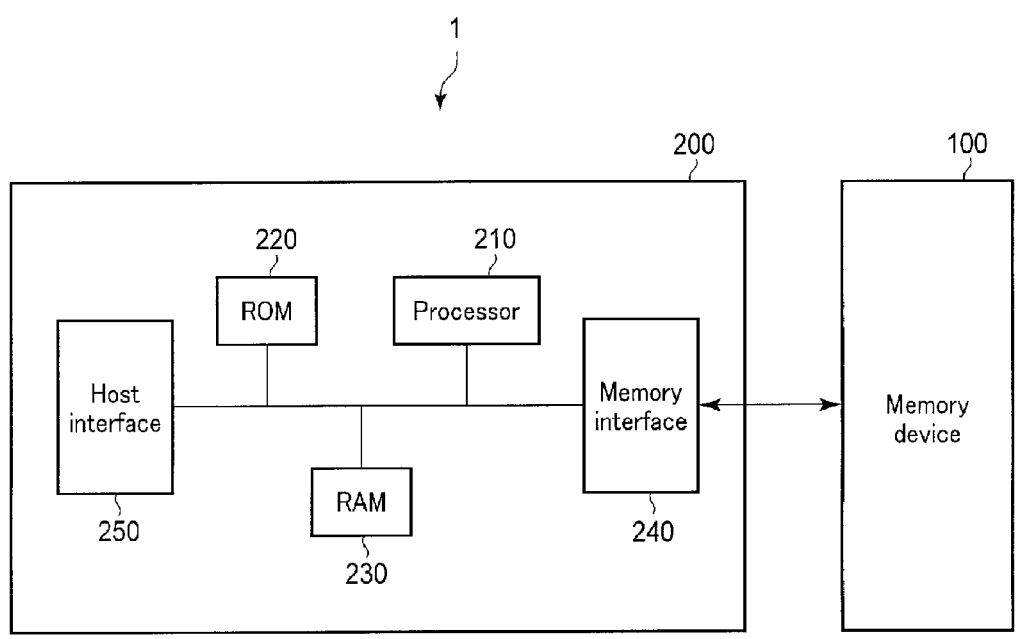
F I G. 1

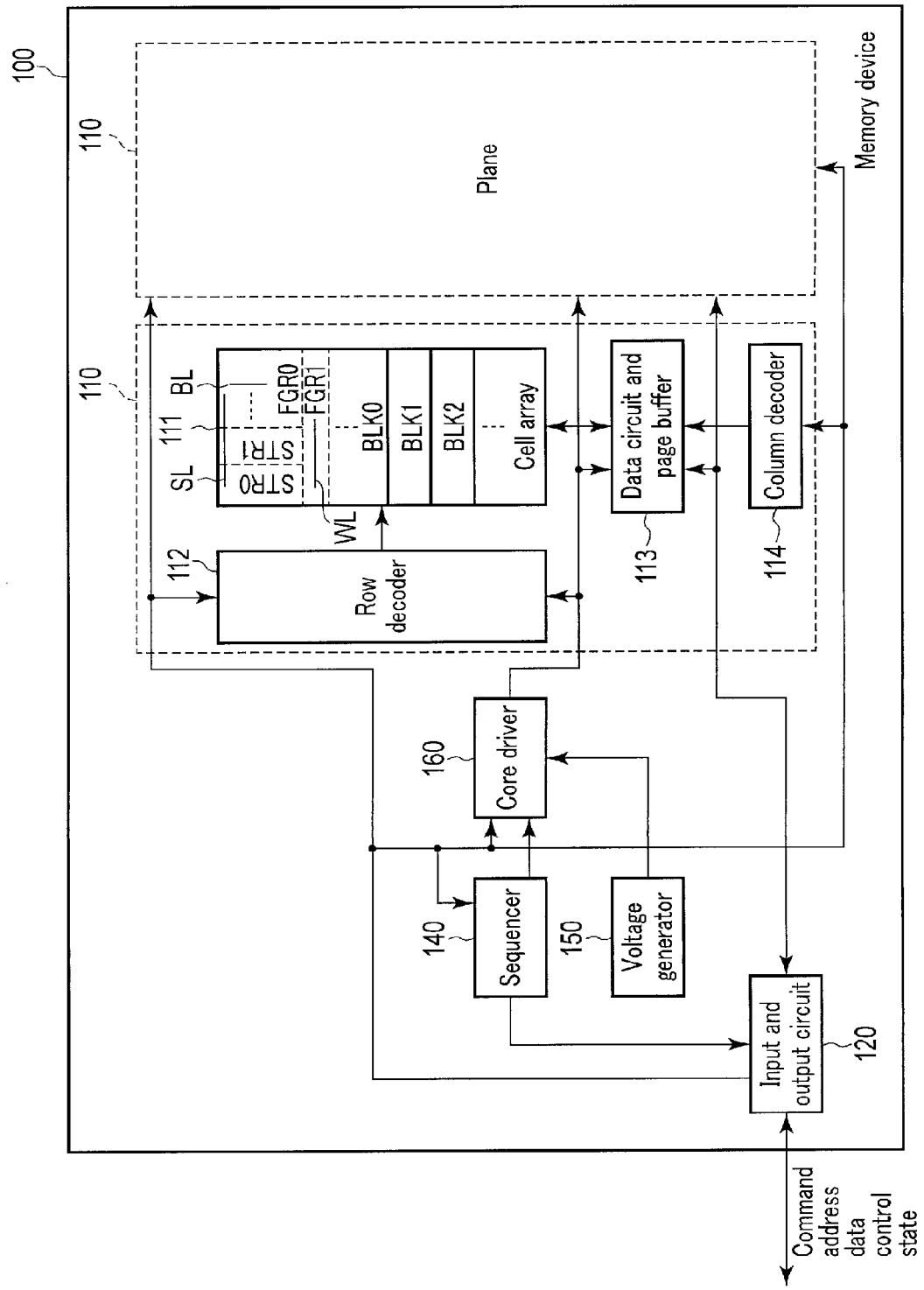
F I G. 2

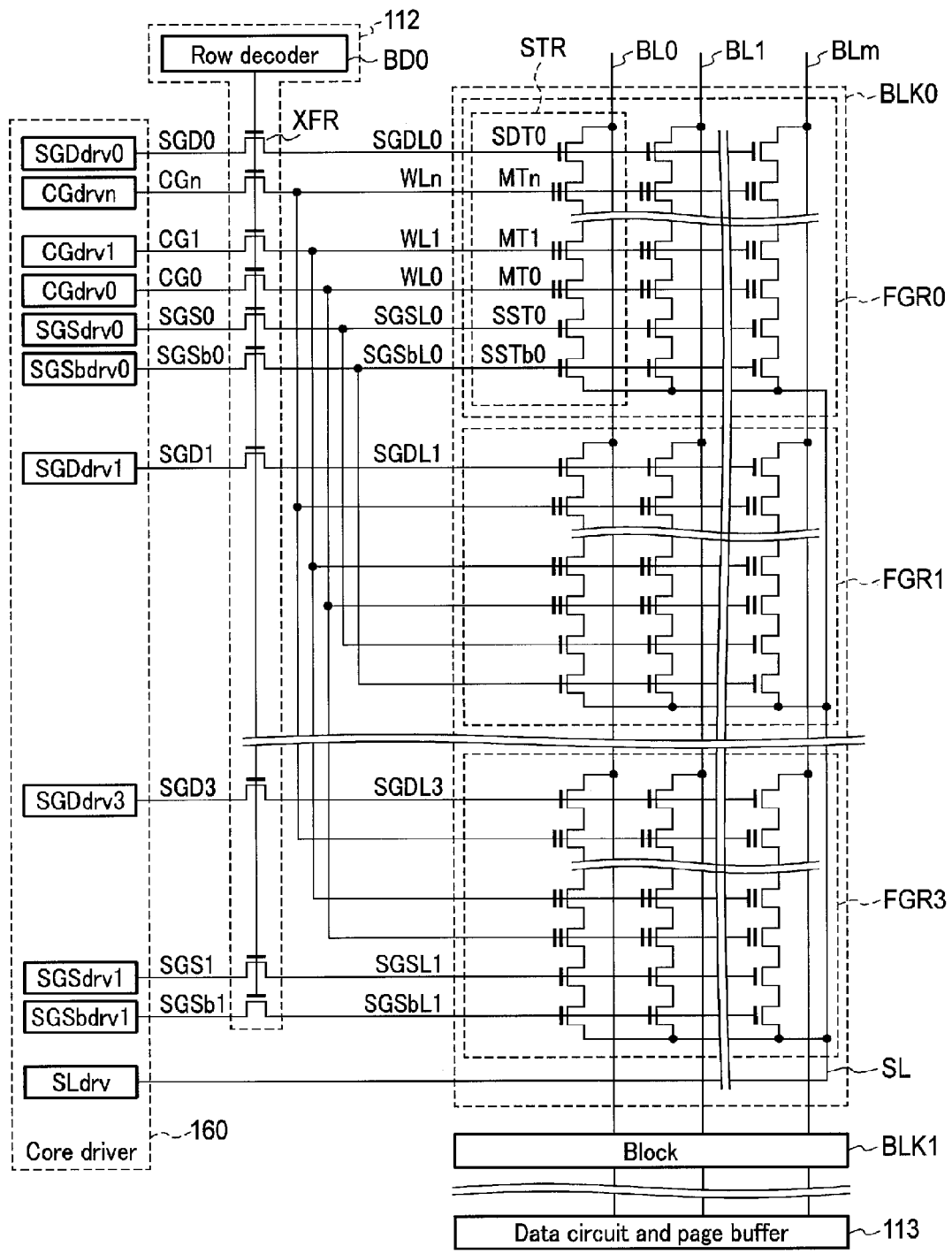
F I G. 3

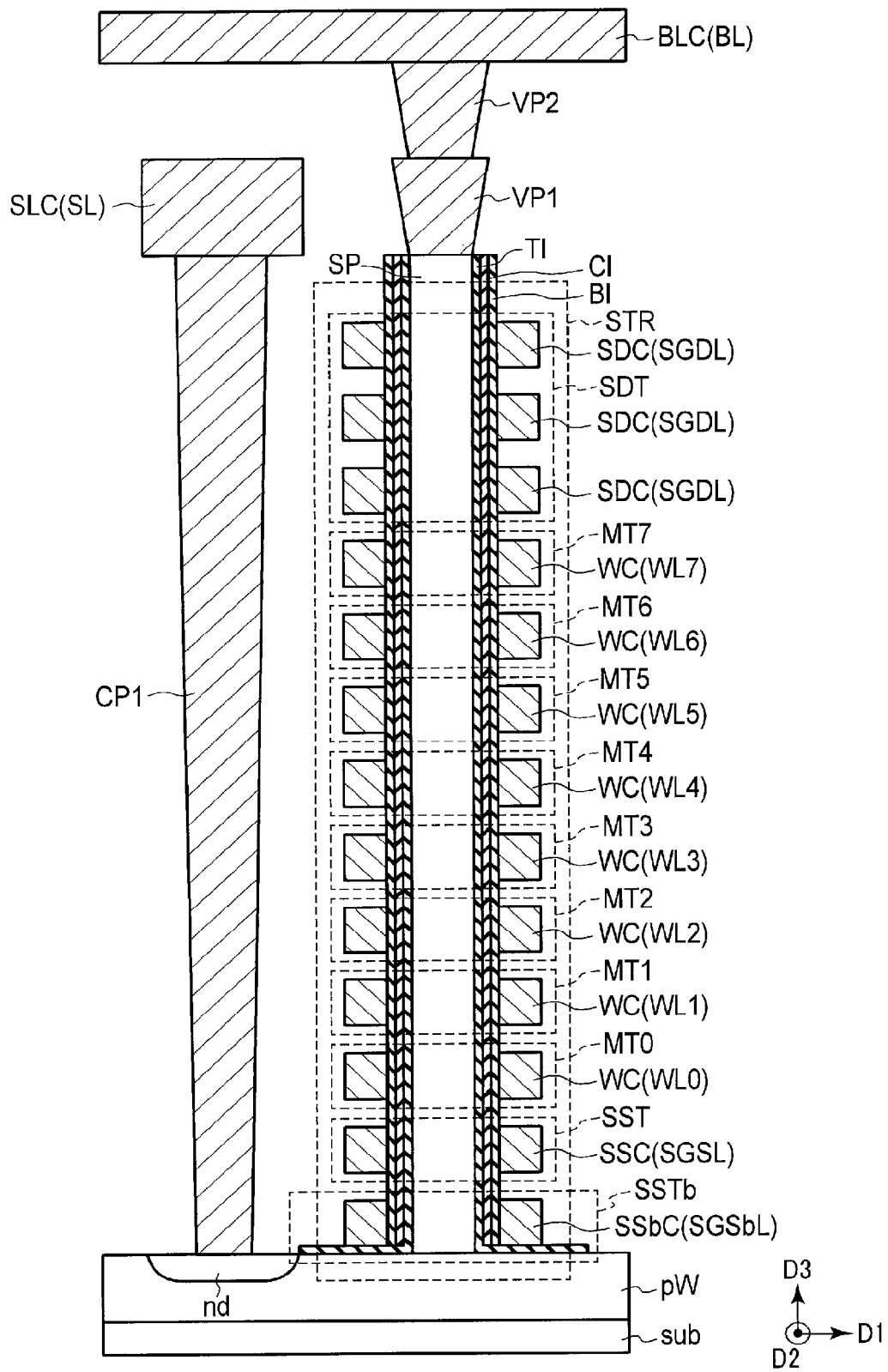
F I G. 5

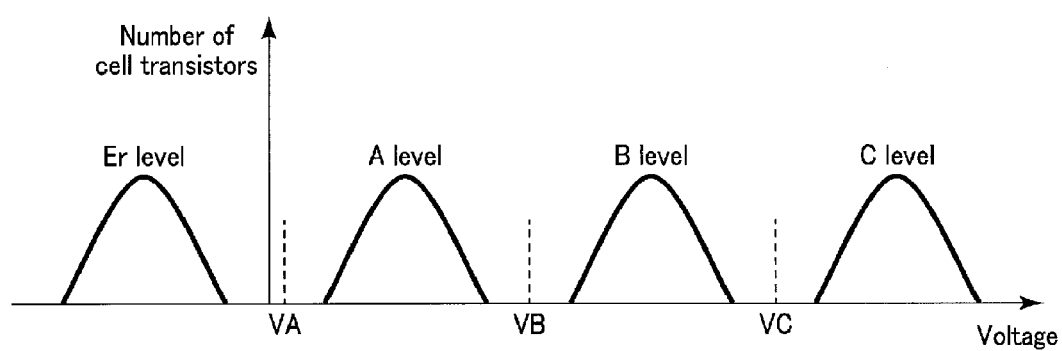
F I G. 6

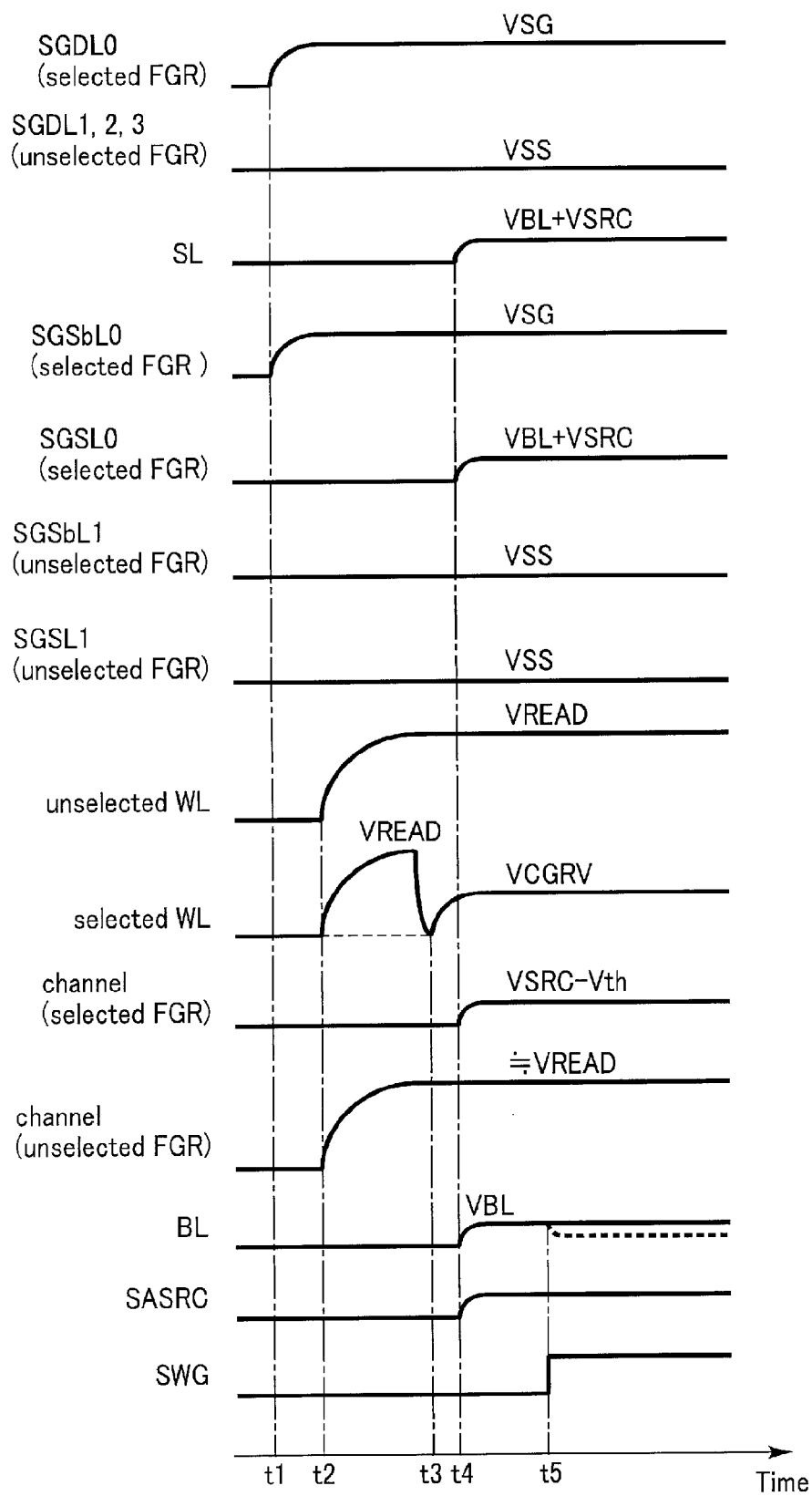
F I G. 7

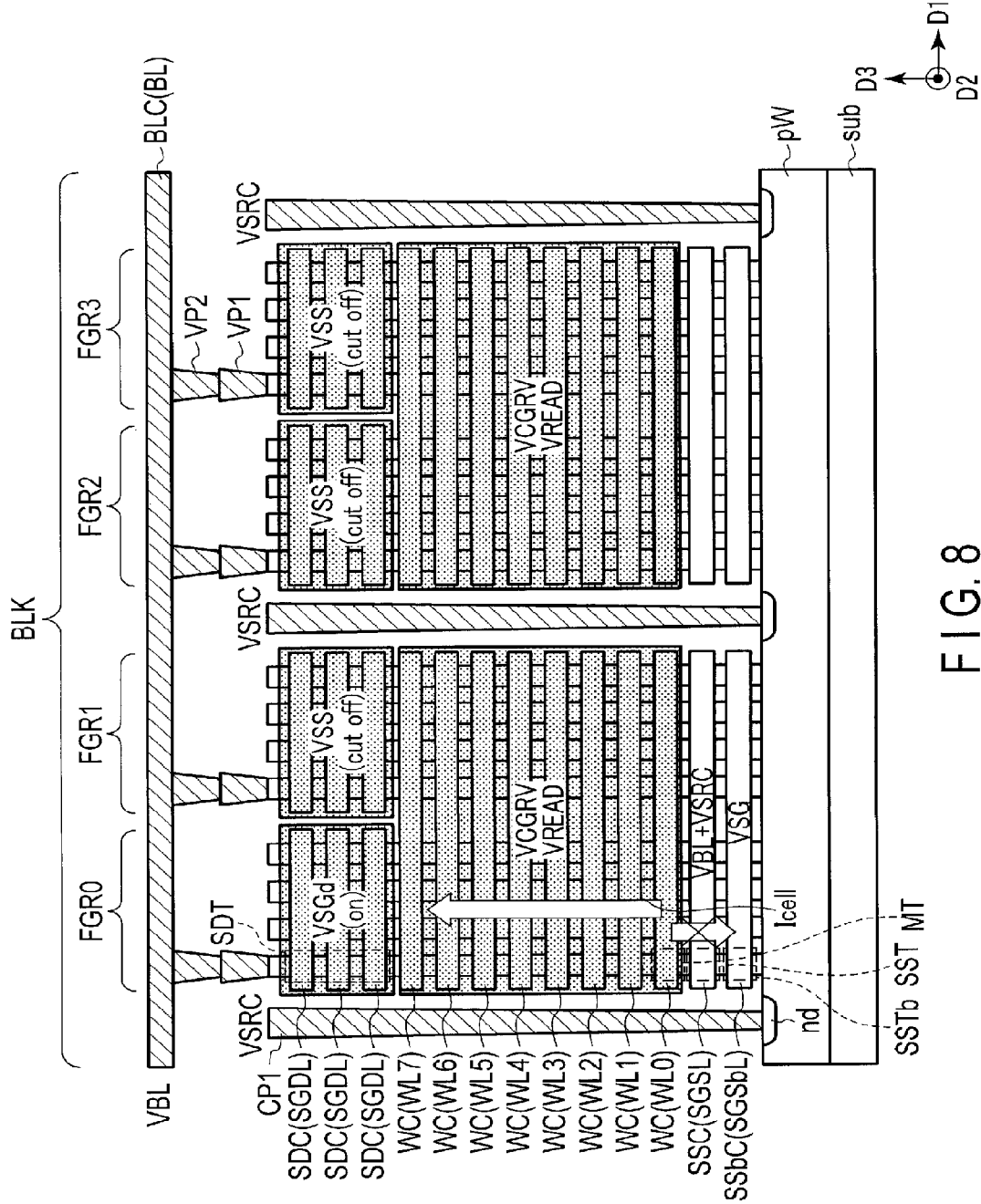
F I G. 8

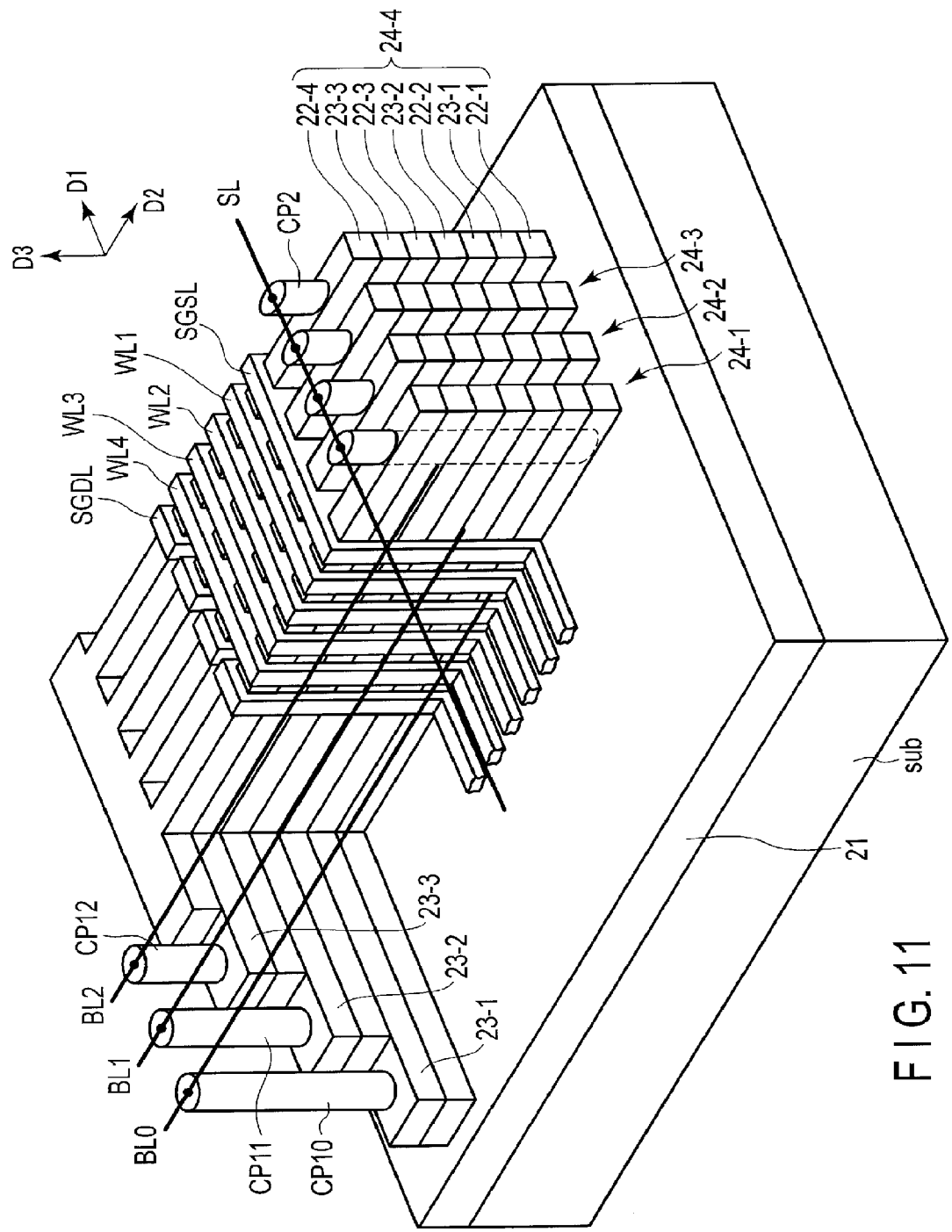
F I G. 11

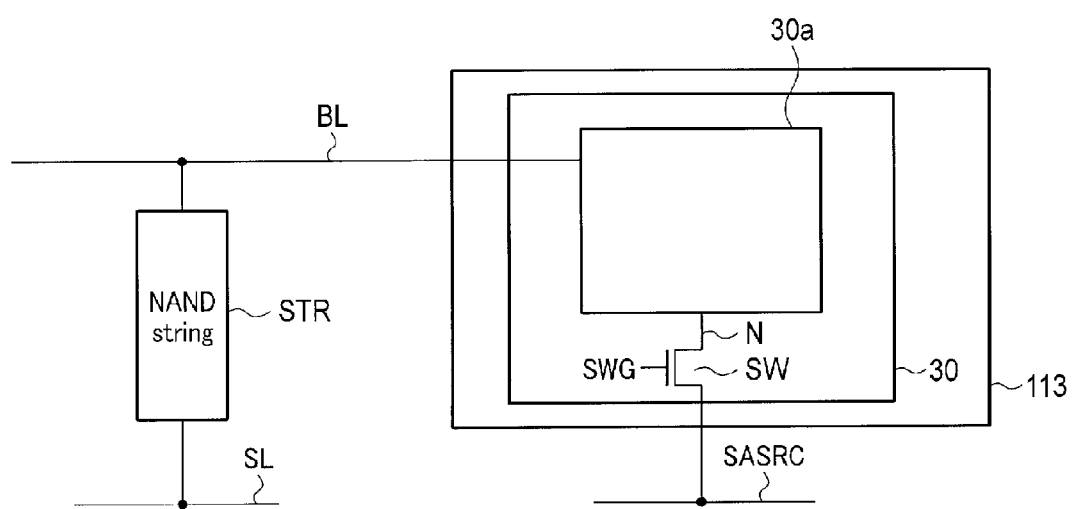
F I G. 14

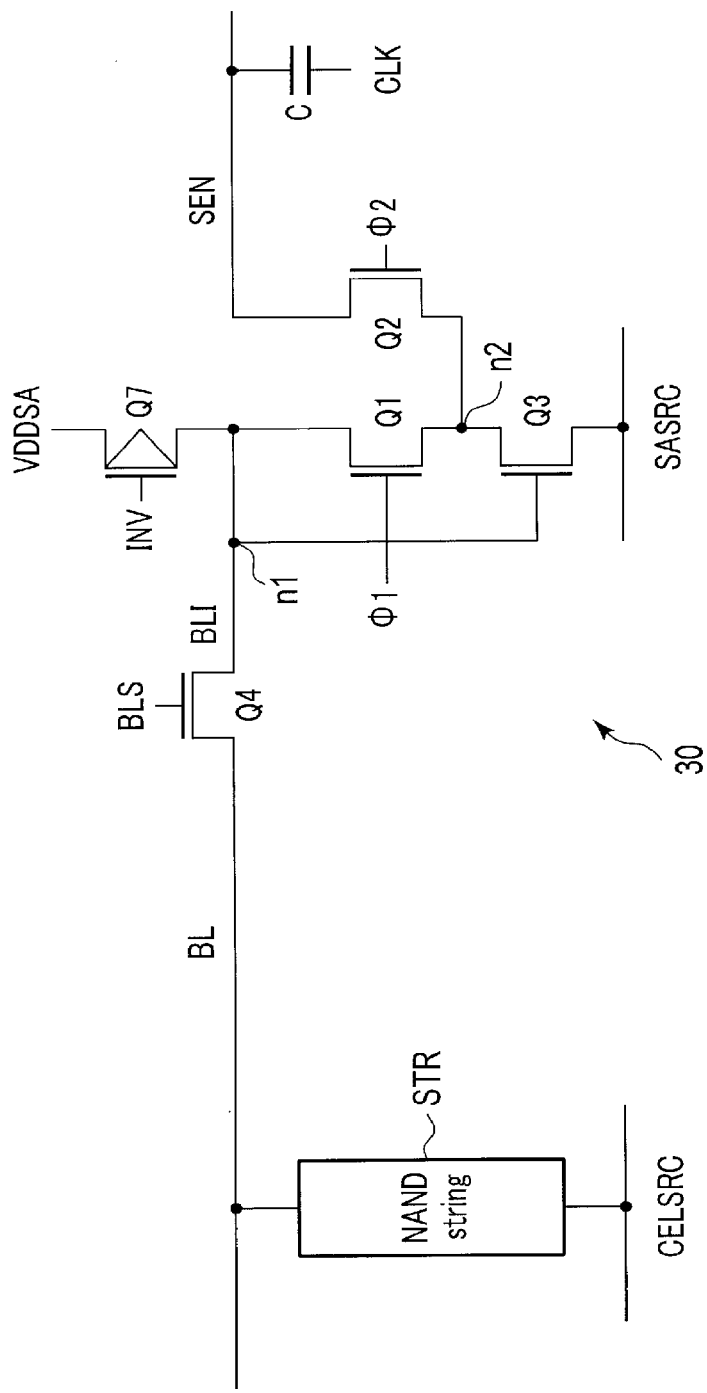
F I G. 15

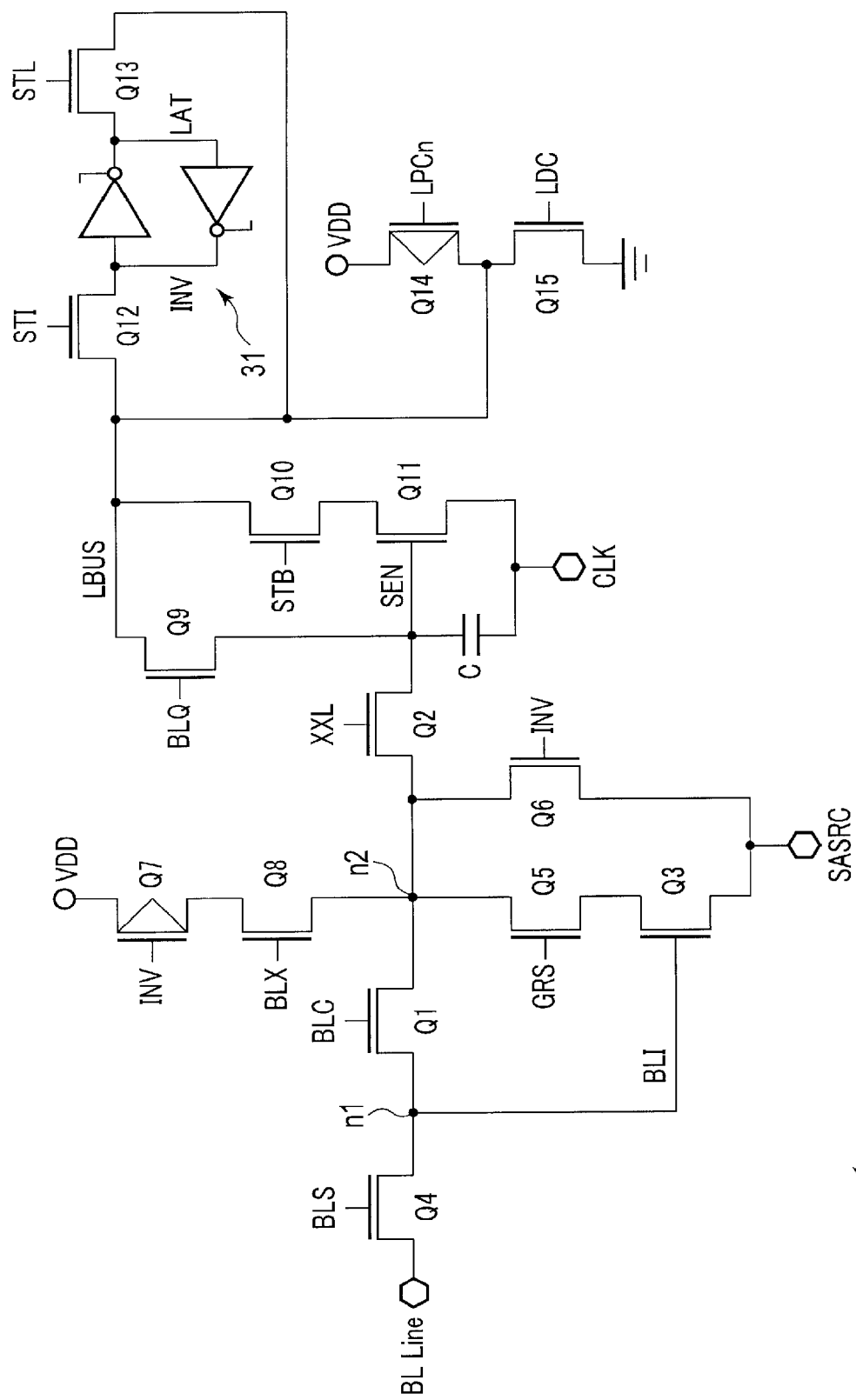
F I G. 24

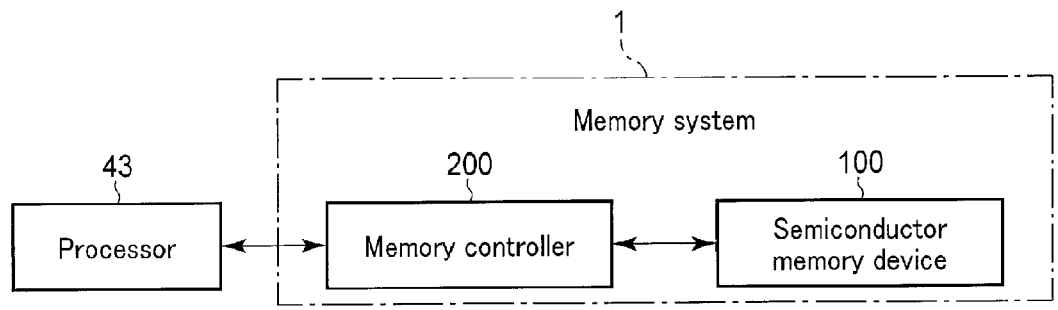
F I G. 25
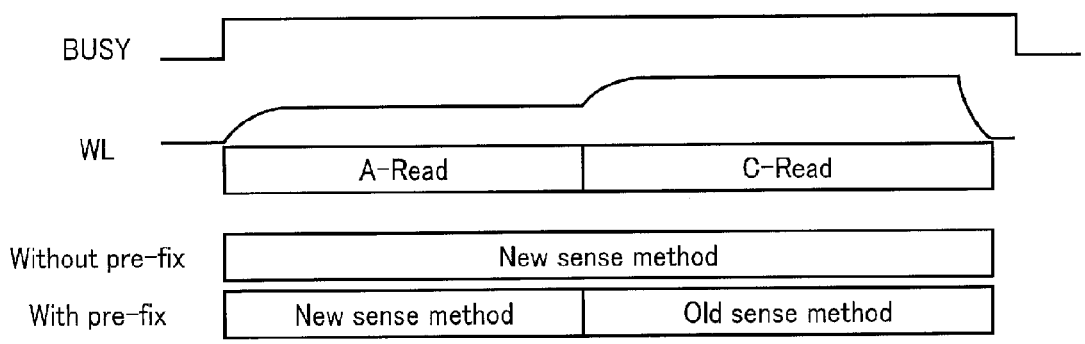
F I G. 26
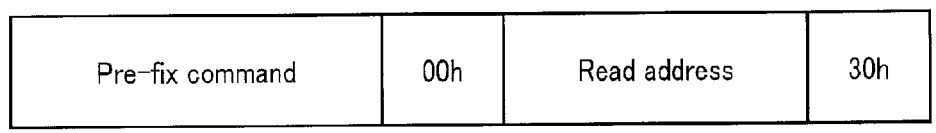
F I G. 27

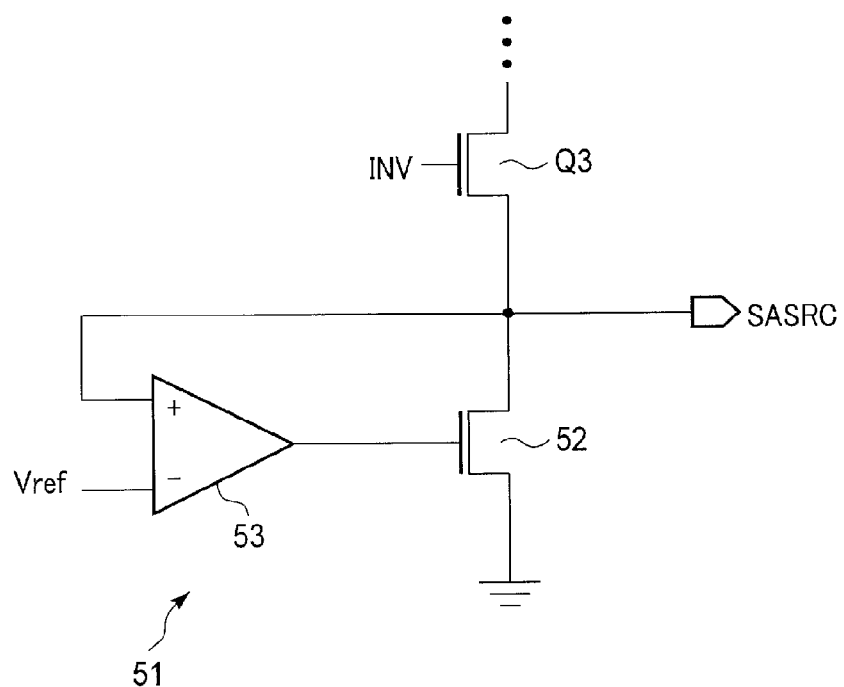
F I G. 28

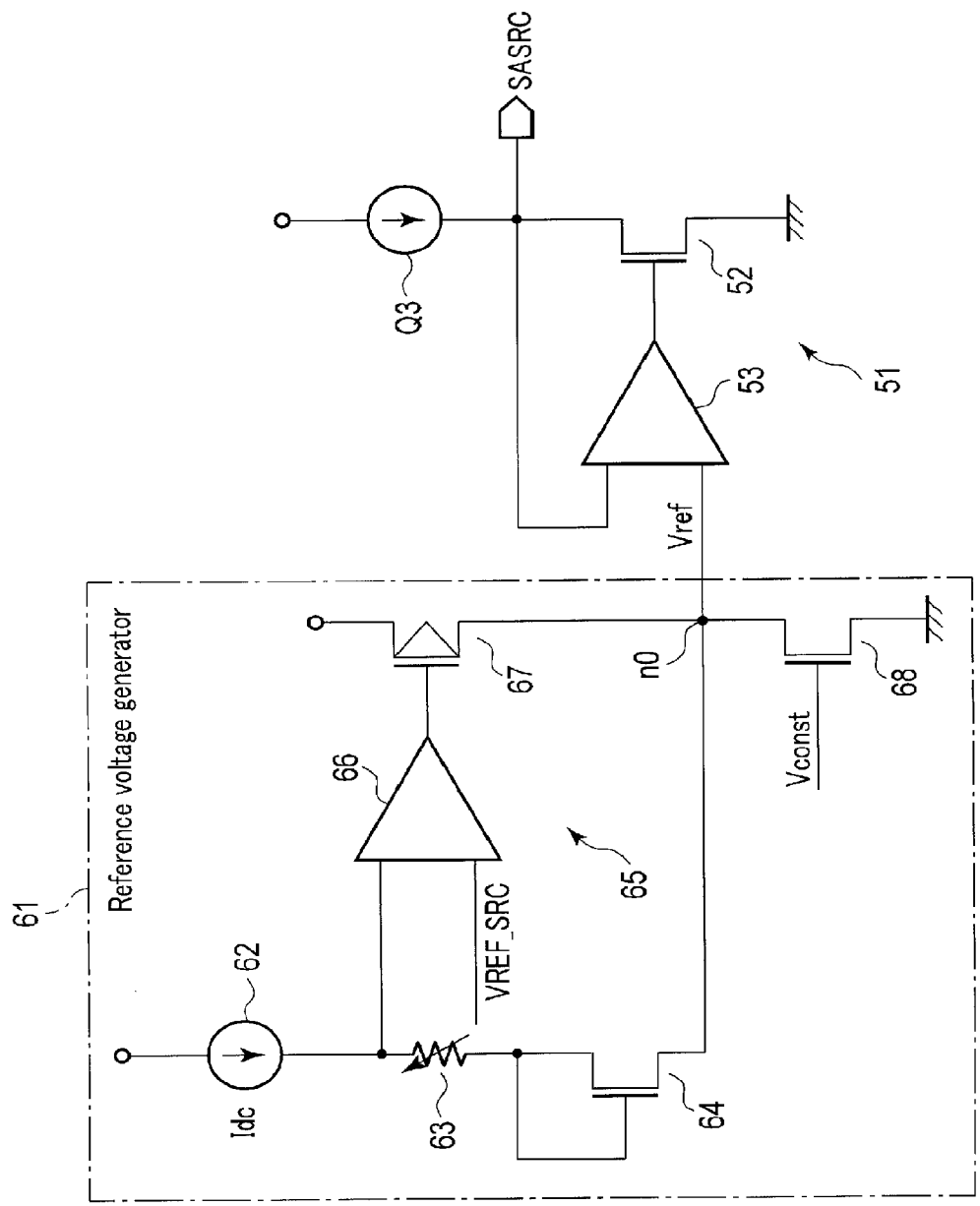
F I G. 29

SEMICONDUCTOR MEMORY DEVICE

CROSS-REFERENCE TO RELATED APPLICATIONS

This application is based upon and claims the benefit of priority from Japanese Patent Application No. 2015-049724, filed Mar. 12, 2015, the entire contents of which are incorporated herein by reference.

FIELD

Embodiments relate to a semiconductor memory device.

BACKGROUND

NAND flash memories of a three-dimensional structure are known.

BRIEF DESCRIPTION OF THE DRAWINGS

FIG. 1 illustrates a block diagram of a memory system of a first embodiment;

FIG. 2 is a block diagram of a semiconductor memory device of the first embodiment;

FIG. 3 illustrates part of a cell array and connections of associated components of the semiconductor memory device of the first embodiment;

FIG. 5 illustrates a part of the section of FIG. 5 in detail;

FIG. 6 illustrates an example of distributions of threshold voltages of cell transistors;

FIG. 7 illustrates voltages of nodes in the semiconductor memory device of the first embodiment with time;

FIG. 8 illustrates one state during a read of the semiconductor memory device of the first embodiment;

FIG. 11 is a perspective view of part of a cell array of a semiconductor memory device of a third embodiment;

FIG. 14 illustrates the sense amplifier and associated components of the semiconductor memory device of the first embodiment;

FIG. 15 illustrates a simplified circuit diagram for describing the principle of operation of a sense amplifier 30 according to the fourth embodiment;

FIG. 24 illustrates a circuit diagram of a sense amplifier 30 according to a sixth embodiment;

FIG. 25 illustrates a schematic block diagram of the memory system 1 which includes a memory controller 200 and the semiconductor memory device 100;

FIG. 26 illustrates a schematic timing chart for a case instruction by a prefix command;

FIG. 27 illustrates a figure illustrating an example of a transmission procedure of an external prefix command;

FIG. 28 illustrates a circuit diagram illustrating an example of a voltage adjuster 51 which adjusts the voltage of a SASRC node; and FIG. 29 illustrates a circuit diagram illustrating an example of a reference voltage generator 61.

DETAILED DESCRIPTION

Figure 4:
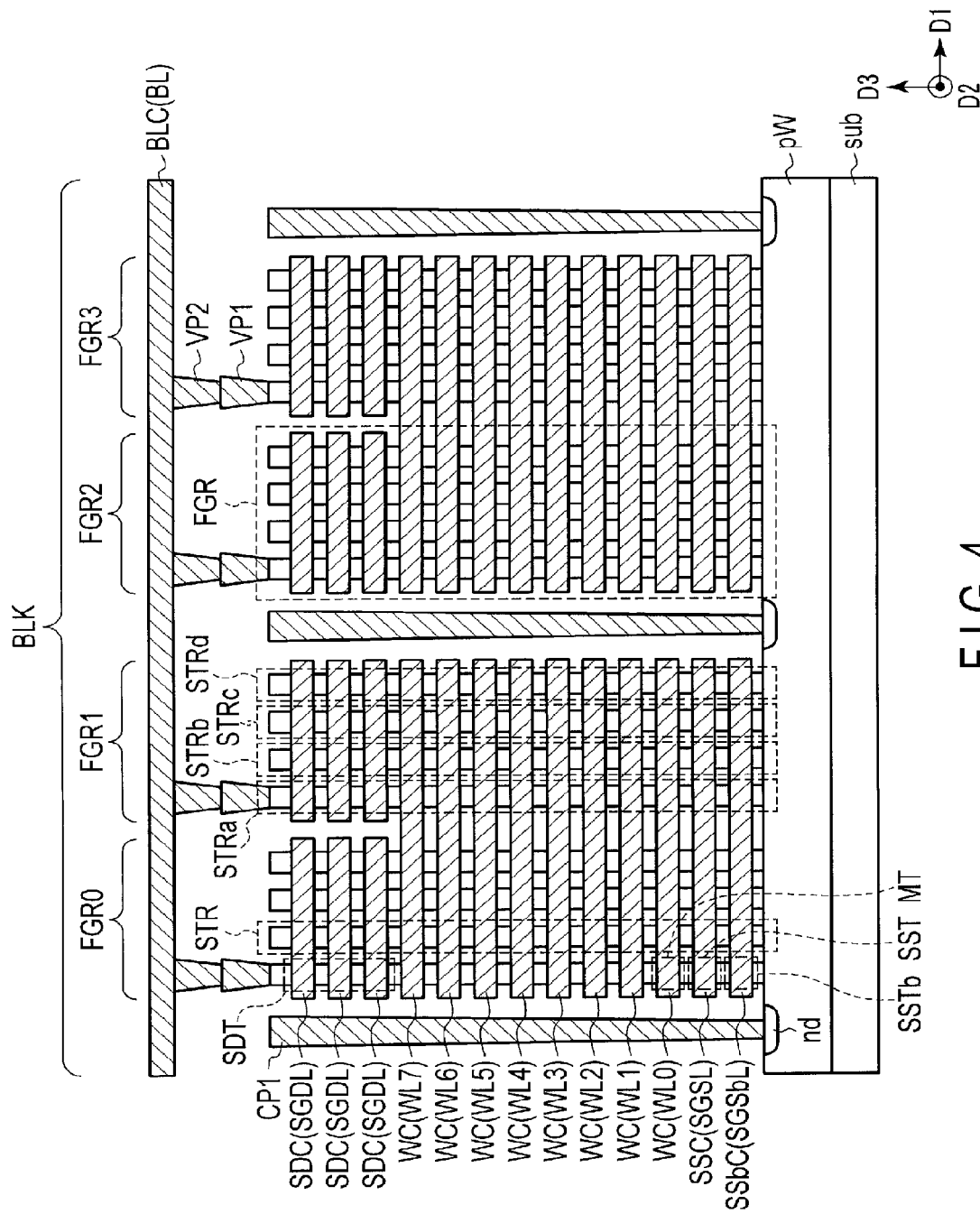
FIG. 4 illustrates a cross-section of the cell array of the semiconductor memory device of the first embodiment.

A memory device according to one embodiment includes a first string and a second string. The first string includes a first transistor serially-coupled to a source line, a second transistor serially-coupled to the first transistor, and first cell transistors serially-coupled between the second transistor and a bit line. The second string includes a third transistor serially-coupled to the source line, a fourth transistor serially-coupled to the third transistor, and second cell transistors serially-coupled between the fourth transistor and the bit line. During a read, a gate of the fourth transistor is applied with a voltage to turn off the transistor, and after start of application of voltages to the first cell transistors, the gate of the fourth transistor is applied with a voltage substantially the same as a voltage applied to the source line.

Embodiments will now be described with reference to the figures. In the following description, components with substantially the same functionalities and configurations will be referred to with the same reference numeral, and repeated description may be omitted. Moreover, all descriptions for a particular embodiment are also applicable as descriptions for another embodiment unless stated otherwise. The figures are schematic, and the relations between the thickness and the area of a plane of a layer and ratios of thicknesses of layers may differ from actual ones. The figures may include components which differ in relations and/or ratios of dimensions in different figures.

First Embodiment

As illustrated in FIG. 1, a memory system 1 includes a semiconductor memory device 100 and a memory controller 200.

The memory controller 200 receives commands from, for example, a host device (not shown), and controls the semiconductor memory device 100 based on the received commands. The memory controller 200 includes components, such as a central processing unit (CPU) 210, a read only memory (ROM) 220, a random access memory (RAM) 230, a memory interface 240, and a host interface 250.

When a program stored in the ROM 220 is executed by the processor 210, the memory controller 200 performs various operations. The RAM 230 stores temporary data. The memory interface 240 is coupled to the semiconductor memory device 100, and manages communications between the memory controller 200 and the semiconductor memory device 100. The host interface 250 is coupled to the host device via a bus, and manages communications between the memory controller 200 and the host device.

As illustrated in FIG. 2, the semiconductor memory device 100 includes components, such as plural planes 110, an input and output circuit 120, an address and command register 130, a sequencer (or, controller) 140, a voltage generator 150, and a core driver 160.

FIG. 2 illustrates an example of two planes 110. The planes 110 include the same set of components. Each plane 110 includes a cell array ill, a row decoder 112, a data circuit and page buffer 113, and a column decoder 114.

The cell array 111 includes blocks BLK.

Each block BLK includes plural fingers FGR (FGR0, FGR1, . . . ). Each finger FGR includes plural (NAND) strings STR. Each string STR includes memory cells. The cell array 111 is provided with components, such as word lines WL, bit lines BL, a source line SL, and select gate lines therein.

The input and output circuit 120 is coupled to the memory interface 240 of the memory controller 200. The input and output circuit 120 controls input and output of signals, such as commands, address signals, data, and control signals, to and from the memory controller 200. The sequencer 140 receives commands from the input and output circuit 120, and controls the voltage generator 150 and the core driver 160 in accordance with the sequence based on the commands. The voltage generator 150 generates various voltages (potentials) based on instructions of the sequencer 140.

The core driver 160 uses the voltages from the voltage generator 150 to generate various voltages to be applied to the word lines WL, the select gate lines, the source line SL, based on the address signals.

The row decoder 112 receives the address signals from the input and output circuit 120, and selects a plane 110, a block BLK, a string STR, and a word line WL based on an address signal.

The data circuit and page buffer 113 includes plural sense amplifiers 30, temporarily stores data read from the cell array 111, and receives write data from the outside of the semiconductor memory device 100, and writes the received data in selected memory cells. The column decoder 114 receives the address signals and controls input and output of data of the data circuit and page buffer 113 based on the address signals.

Part of the cell array and associated components are coupled as illustrated in FIG. 3. Each block BLK includes plural fingers FGR0 to FGRk, where k is a natural number, such as three. In FIG. 3, parts, for example, finger FGR2 and associated components are omitted.

Each bit line BL (BL0 to BLm) is coupled to four strings STR in each block BLK.

Each string STR includes cell transistors MT (MT0 to MT7), select gate transistors SST (SST0 to SST3), SSTb (SSTb0 to SSTb3), and SDT (SDT0 to SDT3). The transistors SSTb, SST, and MT and SDT are coupled in series between the source line SL and one bit line in this order. The transistors SST may be coupled to the source line SL, without the transistors SSTb.

A set of strings STR of different bit lines BL make one finger FGR. In each finger FGR, for each x being zero or a natural number equal to or less than seven), the gate of a cell transistor MTx is coupled to a word line WLx in common. In each block BLK, the word lines WLx in different fingers FGR are coupled to each other.

In each finger FGR, for each y (y being zero or a natural number equal to or less than k), the gate of a transistor SDTy of each of strings STR of each finger FGRy is coupled to a select gate line SGDLy in common.

The gate of each transistor SST of the fingers FGRy and FGR (y+1) is coupled to a select gate line SGSL (y/2) in common. The gate of each transistor SSTb of the fingers FGRy and FGR (y+1) is coupled to a select gate line SGSbL (y/2) in common.

In only one selected block BLK, the row decoder 112 couples a select gate line SGDLk to an SG line SGDk, couples a select gate line SGSLk to an SG line SGSk, couples a select gate line SGSbLk to an SG line SGSbk, and couples a word line WLx to a CG line CGx.

The SG line SGDy is driven by a driver SGDdrvy. An SG line SGSz (z being zero or a natural number equal to or less than (k−1)/2) is driven by a driver SGSdrvz. The SG line SGSbz is driven by a driver SGSbdrvz. The CG line CGx is driven by a driver CGdrvx. The source line SL is driven by a driver SLdrv.

The drivers SGDdrv, SGSdrv, SGSbdrv, CGdrv, and SLdry are controlled by the sequencer 140 to apply various voltages to the coupled interconnects during a read, write or erasure of data.

The cell array 111 has the structure illustrated in FIGS. 4 and 5. FIG. 4 illustrates four fingers FGR along the x-axis. FIG. 5 illustrates part of FIG. 4 in detail.

A p-type well area pW is provided in the surface of the substrate sub, and semiconductor pillars SP are provided on the well area pW. The side of each semiconductor pillar SP is covered with a tunnel insulator TI. The side of the tunnel insulator TI is covered with a charge storage film CI of insulating material. The side of the charge storage film CI is covered with a block insulator BI. Each semiconductor pillar SP serves as a current path for a string STR, and provides areas in which the channel for the cell transistors MT and the select gate transistors SST and SDT are formed. The tunnel insulator TI, the charge storage film CI, and the block insulator BI are illustrated only in FIG. 5.

Above the well area pW, conductive interconnect layers SSbC and SSC, conductive interconnect layers WC, and conductive interconnect layers SDC spread along the D12 plane. The interconnect layers SSbC and SSC, the set of the interconnect layers WC, and the set of interconnect layers SDC line up along the D3-axis in this order, and have an interval along the D3-axis. The interconnect layers SSbC and SSC, WC, and SDC are in contact with the block insulator BI. The interconnect layers SSC serve as the select gate lines SGSL. The interconnect layers SSbC serve as the select gate lines SGSbL. The interconnect layers WC serve as the word lines WL. The interconnect layers SDC serve as the select gate lines SGDL.

Of a semiconductor pillar SP, a tunnel insulator TI, a charge storage film CI, and a block insulators BI, a section intersecting an interconnect layer SSbC serves as a select gate transistor SSTb, a section intersecting an interconnect layer SSC serves as a select gate transistor SST, and a section intersecting an interconnect layer WC serves as a cell transistor MT.

Transistors SSTb, SST, MT and SDT which line up along the D3-axis correspond to the transistors included in one string STR.

Interconnect layers BLC are provided above, along the D3-axis, the semiconductor pillars SP. The interconnect layers BLC serve as the bit lines BL, extend along the D1-axis, and have an interval along the D2-axis. An interconnect layer BLC is coupled to the top of plural strings STR via plugs VP1 and VP2.

Plural strings STR are provided at different coordinates on the D2-axis. Such strings STR at different coordinates on the D2-axis correspond to strings STR included in a finger FGR.

Although the strings STRb, STRc, and STRd are located in planes different from FIG. 4 plane which illustrates the string STRa, they are illustrated in FIG. 4 for convenience.

In each finger FGR, the interconnect layer SDC surrounds the block insulators BI on the sides of all the semiconductor pillars SP in this finger FGR, and is independent for each finger FGR.

In contrast, the interconnect layers WC, interconnect layer SSC, and the interconnect layer SSbC extend over adjacent two fingers FGR, and surround the block insulators BI on the sides of all the semiconductor pillars SP in these two fingers FGR. For example, interconnect layers WC, an interconnect layer SSC, and an interconnect layer SSbC extend over the fingers FGR0 and FGR1. Other interconnect layers WC, SSC, and SSbC extend over the fingers FGR2 and FGR3.

An interconnect layer SSC extends over two fingers FGR, and, therefore, the gate of the transistor SST0 the finger FGR0 and the gate of the transistor SST1 of the finger FGR1 are coupled. Similarly, an interconnect layer SSbC extends over two fingers FGR, and, therefore, the gate of the transistor SSTb0 the finger FGR0 and the gate of the transistor SSTb1 of the finger FGR1 are coupled.

In a surface area of the well area pW, a diffusion layer nd of $n^+$-type impurities is further provided. The diffusion layer nd is coupled to the bottom of a contact plug CP1. The contact plug CP1 extends along the plane of the D2-axis and D3-axis, and is provided between every two sets of the two fingers FGR which share the interconnect layers WC, SSC, and SSbC. The top of the contact plug CP1 is coupled to an interconnect layer SLC. The interconnect layer SLC serves as the source line SL. The interconnect layer SLC is omitted in FIG. 4.

The structure of the cell array 100 is described in U.S. Patent application publication 2009/0267128 titled "THREE DIMENSIONAL STACKED NONVOLATILE SEMICONDUCTOR MEMORY", for example. It is also described in U.S. Patent application publication 2009/0268522 titled "THREE DIMENSIONAL STACKED NONVOLATILE SEMICONDUCTOR MEMORY", U.S. Patent application publication 2010/0207195 titled "NON-VOLATILE SEMICONDUCTOR STORAGE DEVICE AND METHOD OF MANUFACTURING THE SAME", and U.S. Patent application publication 2011/0284946 titled "SEMICONDUCTOR MEMORY AND METHOD FOR MANUFACTURING SAME." The entire contents of these patent applications are incorporated herein by reference.

Each sense amplifier 30 is coupled to one bit line BL as illustrated in FIG. 14. Each sense amplifier 30 includes a switch SW and a section 30a. The switch SW is coupled between a node N, which is electrically coupled to a bit line BL during a read, and an SASRC node, and is a metal oxide semiconductor field effect transistor (MOSFET) of an n-type, for example. The switch SW is turned on and off by a signal SWG from the sequencer 140.

(Operation)

The memory device 100 can store data of one or more bits in one cell transistor MT. Each cell transistor MT can take various threshold voltages based on the data to be stored. The threshold voltage depends on the quantity of the electrons in the charge storage film CI of a cell transistor MT. One or more read voltages are used in order to distinguish data stored by a read-target cell transistor MT. Whether the threshold voltage of the read-target cell transistor is above or below a read voltage is used to determine the threshold voltage of this cell transistor MT.

FIG. 6 illustrates an example of the relation of data stored in the cell transistors and threshold voltages according to the first embodiment. FIG. 6 and the following description are based on the example of storing of two bits per cell transistor. In the case of storage of two bits per cell transistor, each cell transistor MT may have one of four threshold voltages. Even for cell transistors MT storing the same two-bit data, they have different threshold voltages due to variation in properties among them. For this reason, the threshold voltages have distributions, as illustrated in FIG. 6. The threshold voltage distributions are referred to as Er, A, B, and C-levels, for example. The threshold voltages in the A-level are higher than those in the Er-level. The threshold voltages in the B-level are higher than those in the A-level. The threshold voltages in the C-level are higher than those in the B-level.

For determination of the levels, read voltages VA, VB, and VC are used. The read voltage VA lies between the Er and A-levels. The read voltage VB lies between the A and B-levels. The read voltage VC lies between the B and C-levels. The read voltages may be collectively referred to as Vcgrv.

Referring to FIGS. 7 and 8, operation of the semiconductor memory device of the first embodiment will now be described. FIG. 7 illustrates waveforms of voltages applied to some nodes during a read of data from one block BLK. FIGS. 7 and 8 illustrate an example of the read from the cell transistors MT in the finger FGR0. Note that a read of data includes a read for program verification. The program verification refers to determination on whether a program (or, write) target cell transistor MT has the threshold over a value according to data to be stored.

When the semiconductor memory device 100 receives a read command from the memory controller 200, a read starts. All the nodes illustrated in FIG. 7 are applied with the ground (or, common) voltage when the read starts.

As illustrated in FIGS. 7 and 8, at the time t1 the sequencer 140 controls the core driver 160 to apply a voltage VSG to the select gate line SGDL of a selected finger FGR0. The voltage VSG has a magnitude which turns on the transistor SDT as well as the transistor SSTb. The application of the voltage VSG to the select gate line SGDL0 turns on the transistor SDT0. As a result, the string STR of the selected finger FGR0 is electrically coupled to the bit line BL.

In contrast, even at the time t1, the sequencer 140 controls the core driver 160 to maintain the voltage VSS at the select gate lines SGDL1, SGDL2, and SGDL3 of unselected fingers FGR1, FGR2 and FGR3. This keeps the transistors SDT1, SDT2, and SDT3 off. As a result, the strings of fingers FGR1, FGR2, and FGR3 are electrically disconnected from the bit line BL. Note that the maintenance of the voltage VSS at the select gate lines SGDL1, SGDl2, and SGDL3 continues up to the last time in FIG. 7.

The sequencer 140 controls the core driver 160 to apply the voltage VSG to the select gate line SGSbL0 at the time t1. The application of the voltage VSG turns on the transistors SSTb0 and SSTb1. The application of the voltage VSG to the select gate line SGSbL0 couples the two diffusion layers nd at the both side of the set of fingers FGR0 and FGR1 by an n-type area.

In contrast, the sequencer 140 maintains the select gate line SGSL0 at the voltage VSS even at the time t1. This keeps the transistors SST0 and SST1 off.

Thus, both the transistors SST0 and SST1 are off to keep both the fingers FGR0 and FGR1 electrically disconnected from the source line SL. In contrast, the transistor SGT0 is on and the transistor SGT1 is off. This makes the channel of the finger FGR0 electrically coupled to the bit line BL, whereas the channel of the finger FGR1 electrically float.

In the unselected fingers FGR2 and FGR3, the sequencer 140 maintains the select gate lines SGSL1 and SGSbL1 at the voltage VSS during the read. This makes all the strings STR of the fingers FGR2 and FGR3 and therefore the channels of the fingers FGR2 and FGR3 float during the read. The floating state can also be implemented by applying the same voltage as the select gate lines SGSL0 and SGSbL0 to the select gate lines SGSL1 and SGSbL1.

At the time t2, the sequencer 140 controls the core driver 160 to apply a voltage VREAD to unselected word lines WL. The voltage VREAD has a magnitude to turn on the cell transistors MT regardless of their states, or threshold voltages. The application of the voltage VREAD to the unselected word lines WL continues up to the last time in FIG. 7.

The channels of the unselected fingers FGR1, FGR2, and FGR3 are in the floating state at the time t2, and the word lines WL of the same address are shared by different fingers FGR in one block BLK. Therefore, the voltages in semiconductor pillars SP (i.e., the voltages of the channels) of the finger FGR1, FGR2, and FGR3 rise to the voltage near the voltage VREAD as a result of the capacity coupling between the channels and the unselected word lines WL.

At the time t2, the sequencer 140 further controls the core driver 160 to apply the voltage VREAD to the selected word line WL for a short time. The purpose of this is to make the potentials of the channels of the cell transistors MT in each string STR the same as the potential of the bit line BL coupled to that string STR. The application of the voltage VREAD to the selected word line WL and the unselected word lines WL at the time t2 may start at the time t1.

After the application of the voltage VREAD to the selected word line WL, the sequencer 140 controls the core driver 160 to apply the read voltage Vcgrv to the selected word line WL at the time t3. As a result of the application of the read voltage Vcgrv, among all the cell transistors MT coupled to the selected word line WL (the selected cell transistors MT), those with the threshold voltages higher than the read voltage Vcgrv keep off and those with the threshold voltages lower than the read voltage Vcgrv turn on.

At the time t4 after completion of a rise of the potential of the selected word line WL, the sequencer 140 controls the core driver 160 and the data circuit and page buffer 113 to precharge the bit line BL to the voltage VBL.

Moreover, the sequencer 140 controls the core driver 160 to apply a voltage VBL+VSRC to the source line SL at the time t4. The voltage VSRC is larger than the voltage VSS. Therefore, the potential of the source line SL becomes higher than that of the bit lines BL.

Furthermore, the sequencer 140 controls the core driver 160 to apply the voltage VBL+VSRC to the select gate line SGSbL0 at the time t4. The voltage VBL+VSRC is the same as that applied to the source line SL. This results in the transistor SSTb of the select finger FGR0 receiving the same voltage VBL+VSRC at its source and gate, and, therefore, the transistor SSTb is in a bias state of the diode connection with its side of the source line SL as its anode and its side of the cell transistor MT as its cathode. For this reason, a current can flow through the transistor SST0 from the source line SL to the bit line BL. Similarly, the transistor SST1 is also in the diode-connected state.

The voltages applied to some nodes after the time t4 are illustrated in FIG. 8. FIG. 8 is based on FIG. 4, and illustrates the applied voltages in addition to components illustrated in FIG. 4.

Referring back to FIG. 7, at time t4, the sequencer 140 further applies a voltage Vsasrc to the SASRC node. The voltage Vsasrc is smaller than the voltage VBL+VSRC applied to the source line SL.

The application of the voltages at the time t4 forms a potential difference between the source line SL and the bit line BL. At the time of formation of this potential difference, the transistor SDT0 is on in the selected finger FGR0. For this reason, in the select finger FGR0, a cell current Icell flows in a string STR which has a turned-on selected cell transistor MT from the source line SL to the bit line BL coupled to this string STR through the transistor SST0. In contrast, the cell current Icell does not flow in a string STR which includes a selected cell transistor MT which is off in the selected finger FGR0.

In contrast, in the unselected finger FGR1, the channel is still at the voltage VREAD because of the capacity coupling also at the time t4. The voltage VREAD is higher than the voltage VBL+VSRC of the source line SL. For this reason, for example, in the finger FGR1, a leak current does not flow through transistor SST which is biased with the diode connection, and the channel remains electrically floating. Incidentally, even if the voltage of the channel of the finger FGR1 is lower than the voltage VBL+VSRC at the time t4, when the voltage of the channel of the finger FGR1 becomes higher than the voltage VBL+VSRC by inflow of the current from the source line SL, the transistor SST turns off in the finger FGR1. This makes the channel of the finger FGR1 float.

At the time t4, the source line SL and select gate line SGSL0 may be applied with a voltage VSRC instead of voltage VBL+VSRC. In this case, the voltage VSRC is larger than the voltage VBL, and is larger than the voltage Vsasrc.

After the elapse of a particular time from the time t4, the potentials of nodes in the sense amplifier 30 come to stabilize. At the time t5 after the stabilization, the sequencer 140 makes the signal SWG high. This forms a current path between the bit line BL and the SASRC node. At this time, the cell current Icell flows into the bit line BL in a sense amplifier 30 coupled to a string STR which includes a selected cell transistor MT which is on. For this reason, even with the current path between the bit line BL and the SASRC node, the potential of the node of the bit line BL falls slightly from the potential VBL. In contrast, the cell current Icell does not flow into the bit line BL in a sense amplifier 30 coupled to a string STR which includes a selected cell transistor MT which is off. This makes the potential of the bit line BL fall, as illustrated with the dotted line. This absence or presence of voltage fall (or, difference in magnitude of the fall of potential) is detected by the sense amplifier 30, and the data stored in the cell transistor MT coupled to the selected word line WL in the selected finger FGR0 is distinguished.

(Advantages of the First Embodiment)

As described, according to the semiconductor memory device of the first embodiment, the interconnect layers WC for the word lines WL extend over two fingers FGR. This differs from a comparative example of FIG. 9, in which interconnect layers extend over one finger FGR. If the first embodiment and the comparative example includes the same number of strings STR in one finger FGR, the area of an interconnect layer WC of the first embodiment is larger than the area of the interconnect layer 304 for a word line in the comparative example. This results in a smaller resistance of a word line WL of the first embodiment than that of a word line in the comparative example. This results in a smaller power needed to charge the word lines WL, and smaller power consumption by the semiconductor memory device of the first embodiment.

Moreover, according to the first embodiment, an interconnect layer SSC and an interconnect layer SSbC extend over two fingers FGR as the word lines WL. This can avoid a process for sharing two fingers FGR by the conductive layers WC and making the interconnects SSC and SSbC independent among fingers FGR, and suppress the cost for manufacturing the semiconductor memory device 100. Moreover, the number of the plugs CP1 can be decreased to suppress the chip area. Furthermore, the resistance of the select gate lines SGL and SGSbL decrease, and the performance of the semiconductor memory device 100 can be improved.

However, mere sharing of the interconnect layers SSC and SSbC by two fingers FGR cannot electrically couple such two fingers FGR to the source line SL independently. The details are as follows.

Figure 9:
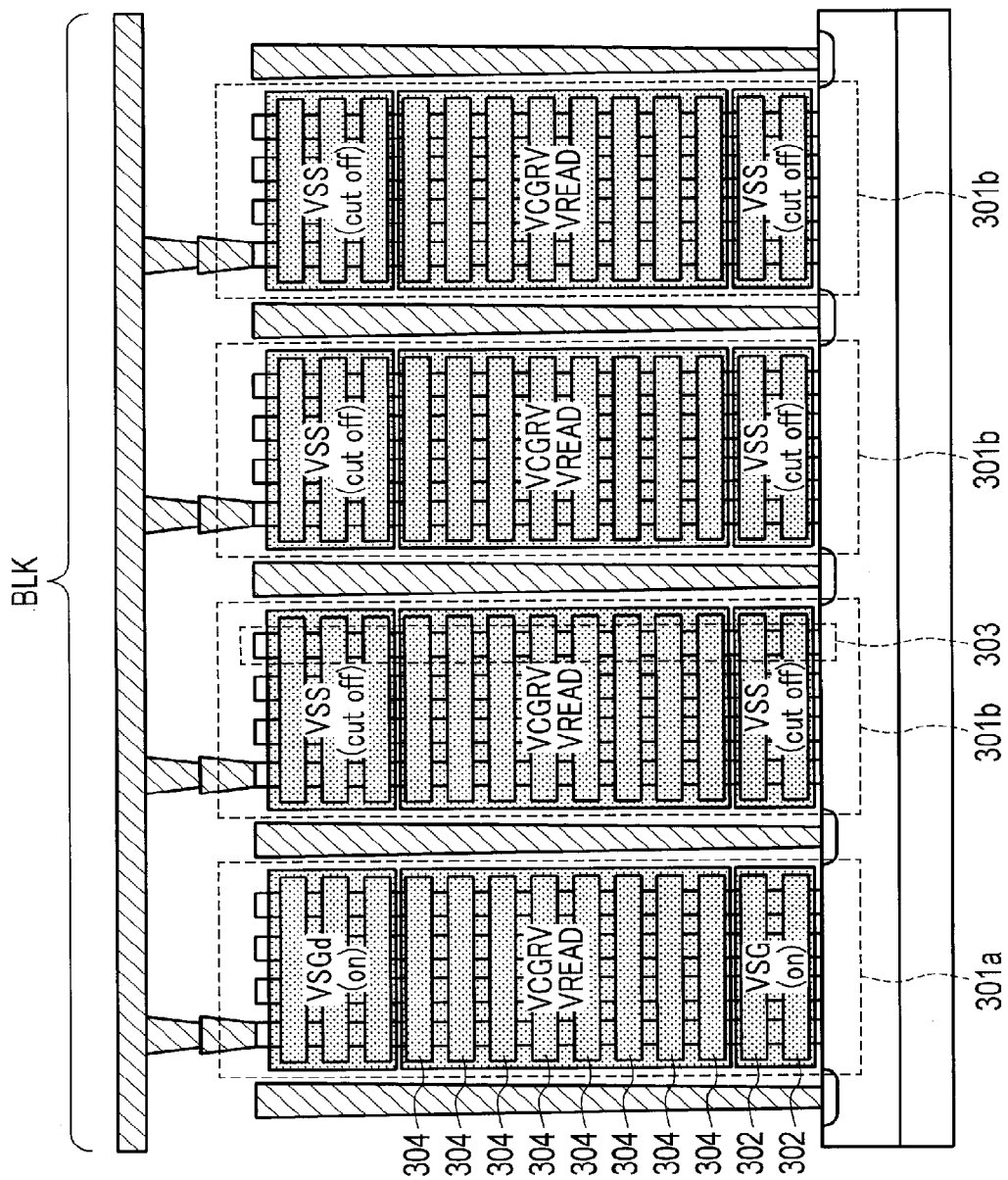
FIG. 9 illustrates a cross-section of a semiconductor memory device for reference.

As compared with the first embodiment, if the select gate line 302 at the source side can be controlled independently for each finger 301 as illustrated in FIG. 9, a string 303 of an unselected finger 301b can be made to electrically float. The potential of the channel of the floating string 303 rises with the rise of the potential of word lines 304. This makes charging the word lines 304 easy. Moreover, the potential difference between the channel of the string 303 of the unselected finger 301b and the word lines 304 is substantially zero. Therefore, the read disturb which would occur with such a potential difference can be avoided.

In contrast, with the interconnect layers SSC and SSbC shared by two fingers FGR, turning the transistor SST0 on during a read results in the finger FGR1 also electrically coupled to the source line SL. For this reason, with the method of the cell current Icell flowing from the precharged bit line BL into the source line SL, the channel of the string STR of the finger FGR1 does not electrically float. This results in addition of capacities to the word lines WL, which in turn increases the current for charging the word lines WL. Furthermore, the potential difference between the channel of the string STR of the finger FGR1 and the word lines WL may cause incorrect writes, read disturbs, and damage to the cell transistors MT.

In a read in the semiconductor memory device 100 of the first embodiment, the cell current Icell flows from the source line SL to the bit line BL as described in the following in detail.

At the time t1, the transistor SDT0 is on, and, therefore, the channel of the finger FGR0 is coupled to the bit line BL. In contrast, the transistors SDT1 and SST1 are off, and, therefore, the channel of the finger FGR1 floats. Therefore, the word lines WL are not added with the capacity from the channel of finger FGR1, which decreases the capacity added to the word lines WL.

Moreover, at the time t4, the transistor SDT0 is on and transistor SST0 is biased as the diode connection. Therefore, raising the potential of the source line SL higher than the potential of the bit line BL allows the cell current Icell to flow through the finger FGR0. In contrast, the transistor SDT1 is off and transistor SST1 is also in the diode-connected state. This prevents the cell current Icell from flowing through the finger FGR1.

Therefore, even if the plural fingers FGR share the interconnect layers WC, both a data read and floating state are implemented. Specifically, while a read in the selected finger FGR0 is enabled, the unselected finger FGR1 can be made to float. This allows for a selection of a finger FGR for a read, decrease of a consumed current for driving the word lines WL that would be high due to the sharing of interconnects WC, and the suppression of the application of a voltage between the channel of the string STR of the unselected finger FGR1 and word lines WL.

Moreover, at the time t2, the voltage VREAD is applied also to the selected word line WL. Some of the selected cell transistors MT are not turned on even if they receive the read voltage Vcgrv at the time t3, depending on their threshold voltages. In a string STR including such a cell transistor MT, the cell transistors MT nearer to the transistor SST than to the cell transistor receiving the voltage Vcgrv receive the voltage VREAD at their gates to have their channels boosted to the voltage VREAD. As a result, the potential of the channel in the string STR does not become uniformly the same as the potential of the corresponding bit line BL. Such state can be avoided by application of the voltage VREAD to the selected word line WL for a short time to allow the potential of the channel in the string STR to be uniform. Moreover, the application of the voltage VREAD to the selected word line WL can drive unnecessary electrons in the channel of the string STR of the selected finger FGR0 out of the channel before the application of the read voltage Vcgrv. For example, when a read starts after an elapse of a long time from the last write, electrons may be distributed unintentionally due to diffusion of the electrons. To address this, all the cell transistors MT in the selected finger FGR0 are turned on through the application of the voltage VREAD to the selected word line WL to drive out the electrons in part of the channel of the selected finger FGR0 nearer to the substrate sub to the bit line BL.

(Other)

It is known that the threshold voltages of the select gate transistors SST and SSTb can be adjusted with, for example, the quantity of electrons in the charge storage films CI thereof. The mechanism of this adjustment is the same as injection of the electrons to charge storage film CI in a cell transistor MT for writing data. A write command for that purpose to the transistors SST and SSTb (to be referred to as a SST write command hereinafter) is known. The semiconductor memory device 100 can recognize and perform the SST write command.

The SST write command instructs injection of electrons into the charge storage film CI of the transistors SST and/or SSTb. The SST write command is accompanied by a signal specifying the address of transistors SST and SSTb for write. When the semiconductor memory device 100 receives the SST write command and the signal specifying the address of a target, the sequencer 140 controls the core driver 160 and the row decoder 112 to inject electrons into the charge storage film CI of the instructed transistor SST and/or SSTb.

Second Embodiment

Figure 10:
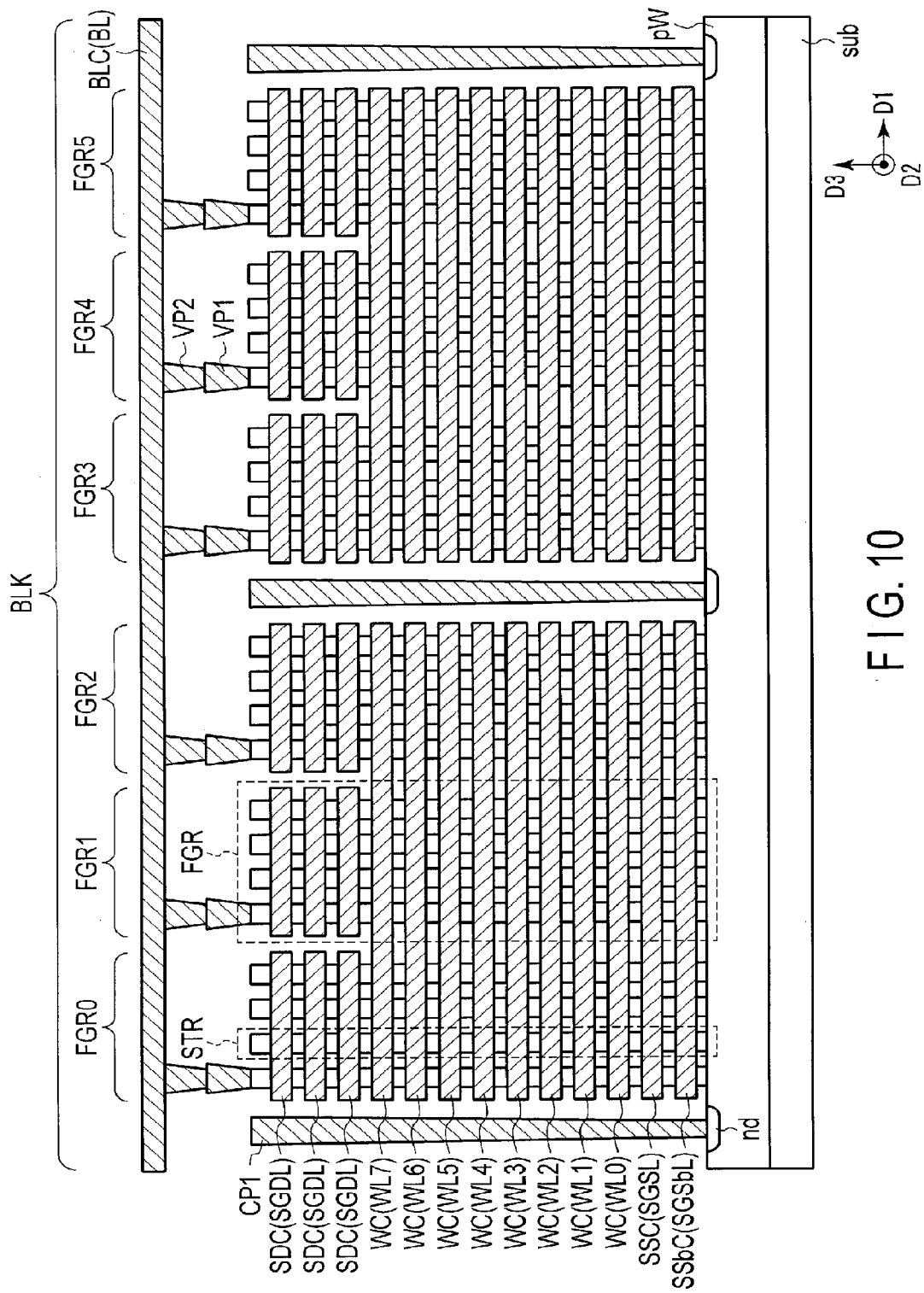
FIG. 10 illustrates a cross-section of part of a cell array of a semiconductor memory device of a second embodiment.

The second embodiment is based on the first embodiment. The word lines WL and the select gate lines SGSL and SGSbL may extend over three or more fingers FGR instead of two fingers FGR as in the first embodiment. The second embodiment relates to such an example. As illustrated in FIG. 10, the word lines WL (or, the interconnect layers WC), the select gate lines SGSL (or, interconnect layer SSC), and the select gate line SGSbL (or, interconnect layer SSbC) extend over three fingers FGR0, FGR1, and FGR2. Similarly, other word lines WL and the select gate lines SGSL and SGSbL extend over three fingers FGR3, FGR4, and FGR5.

In contrast, the select gate lines SGDL (or, interconnect layers SD) are independent for each finger FGR. This point is the same as in the first embodiment.

Between sets of three fingers FGR which share the word lines WL and the select gate lines SGSL and SGSbL, a contact plug CP1 and a diffusion layer nd are located. The application of the voltages during a read in the second embodiment is the same as that in the first embodiment.

The word lines WL (or, interconnect layers WC), the select gate line SGSL (or, interconnect layer SSC), and the select gate line SGSbL (or, interconnect layer SSbC) may extend over four or more fingers FGR.

According to the second embodiment, as in the first embodiment, the interconnect layers WC for the word lines WL, the interconnect SSC for the select gate line SGSL and the interconnect SSbC for the select gate line SGSbL extend over plural fingers FGR, the transistor SST of the selected finger FGR is kept off during the rising of the potentials of the word lines WL, and the cell current Icell is conducted from the source line SL to the bit line BL, and the transistor SST of the selected finger FGR is in the diode connection state during the flow of the cell current Icell. This can produce the same advantages as those in the first embodiment. Furthermore, a larger number of the fingers FGR over which the interconnect layers WC extend than that in the first embodiment allows for lower resistances of the interconnect layers WC in the second embodiment.

Third Embodiment

The third embodiment is based on the first embodiment and differs from the first embodiment in the structure of the cell array.

Figure 12:
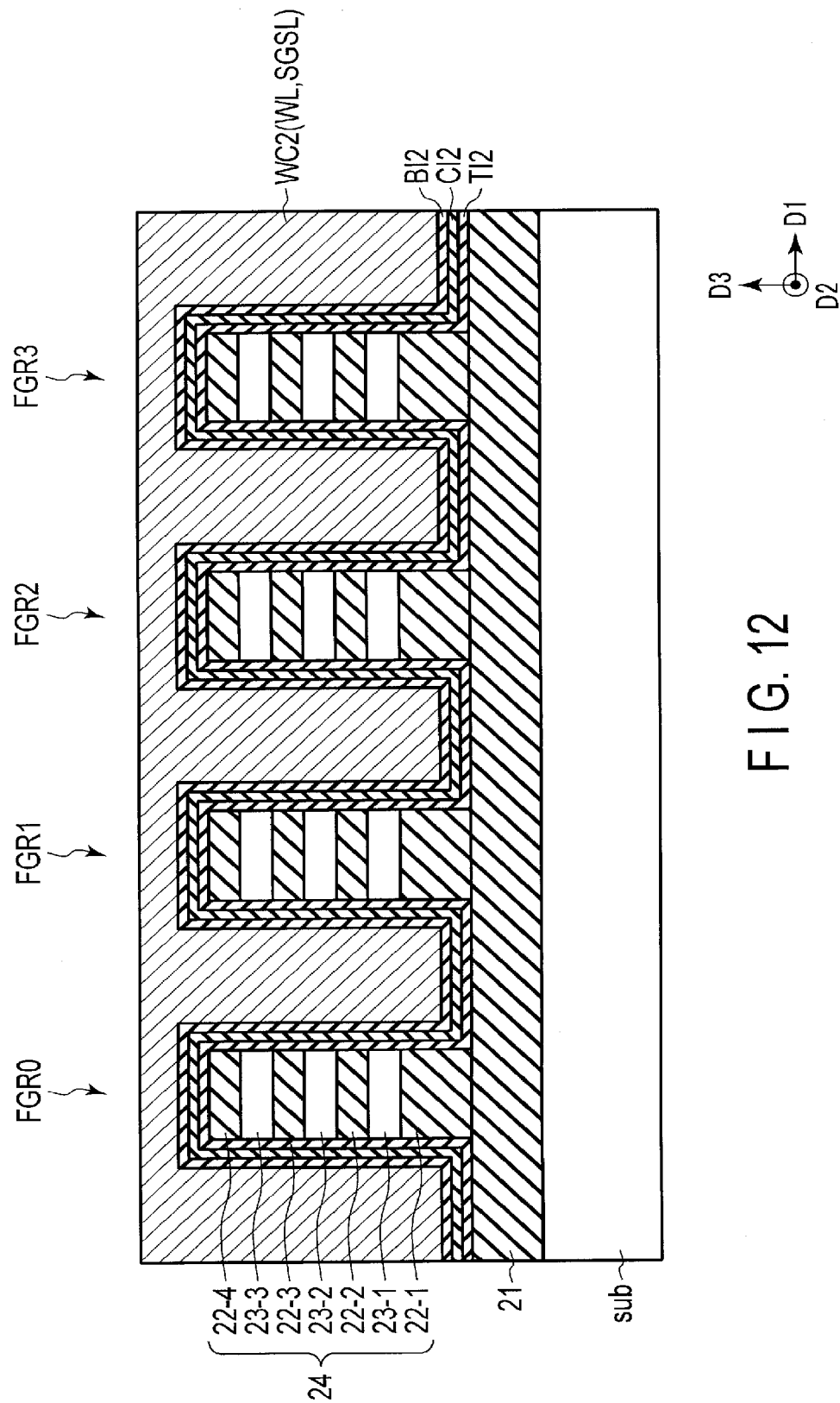
FIG. 12 illustrates a cross-section of the cell array of the semiconductor memory device of the third embodiment.
Figure 13:
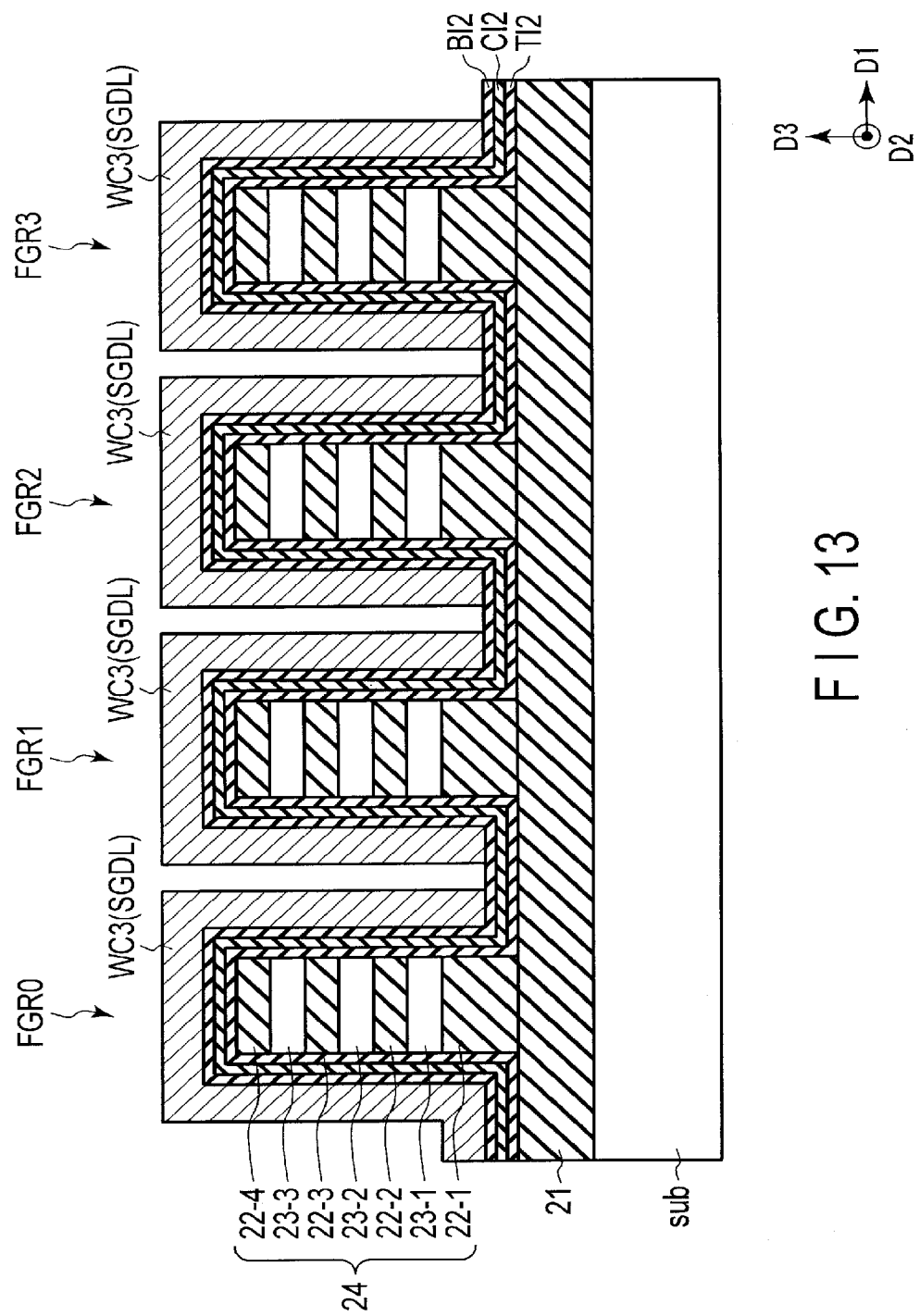
FIG. 13 illustrates a cross-section of another part of the cell array of the semiconductor memory device of the third embodiment.

As illustrated in FIGS. 11 to 13, an insulator 21 is provided on the substrate sub. On the insulator 21, plural (for example, four) fin-type structures 24 (24-0 to 24-3) are provided. The fin-type structures 24 extend along the D2-axis, and have an interval along the D1-axis. The D1-axis and D2-axis are parallel to the substrate sub, and intersect perpendicularly with the D3-axis which is perpendicular to the substrate sub, for example. The D1-axis and D2-axis perpendicularly intersect with each other.

Each fin-type structure 24 includes insulators 22 (22-1 to 22-4) and semiconductor layers 23 (23-1 to 23-3) which are stacked alternately. Each semiconductor layer 23 provides channel regions for one string STR as the semiconductor pillar SP. The set of the semiconductor layers 23 in one fin-type structure 24 corresponds to the set of the semiconductor pillars SP in one finger FGR of the structure of FIG. 4. Therefore, the structure of FIGS. 11 to 13 corresponds to four fingers FGR (FGR0 to FGR3).

On top and side surfaces of each fin-type structure 24, sets of tunnel insulator TI2, an insulating charge storage film CI2, a block insulator BI2, and conductive interconnect layer WC2 are provided. The sets of tunnel insulator TI2, charge storage film CI2, block insulator BI2, and interconnect layer WC2 have a belt shape which extends along the D1-axis, have an interval along with the D2-axis, cover the sides and the top of each fin-type structure 24. Specifically, a set of tunnel insulator TI2, charge storage film CI2, block insulator BI2, and interconnect layer WC2 extends over four fingers FGR0 to FGR3.

Each tunnel insulator TI2 extends along the D1-axis and covers the top and sides of each fin-type structure 24. On each tunnel insulator TI2, a charge storage film CI2 is provided along that tunnel insulator TI2. On each charge storage film CI2, a block insulator BI2 is provided along this charge storage film CI2. On each block insulator BI2, an interconnect layer WC2 is provided along this block insulator BI2.

Of the interconnect layers WC2, one in the very front along the D2-axis serves as the select gate line SGSL. Each area of a semiconductor layer 23 is surrounded by each interconnect layer WC2 for the select gate line SGSL and serves as a select gate transistor SST. The plural (four in FIG. 14) interconnect layers WC2 beyond, along the D2-axis, the interconnect layer WC2 which serves as the select gate line SGSL serve as the word lines WL (WL0 to WL3). Each area of a semiconductor layer 23 surrounded by an interconnect layer WC2 for a word line WL serves as a cell transistor MT.

Beyond, along the D2-axis, the interconnect layer WC2 in the very back (i.e., the interconnect layer WC2 for the word line WL4), a set of tunnel insulator TI2, charge storage film CI2, and block insulator BI2 is provided, and plural conductive films WC3 are provided on the block insulator BI2. Each conductive film WC3 covers the top and sides of one finger FGR with the tunnel insulator TI2, charge storage film CI2, and block insulator BI2 therebetween. Therefore, the conductive films WC3 are independent for each finger FGR. Each conductive film WC3 serves as one select gate line SGDL. Each area of a semiconductor layer 23 surrounded by each conductive film WC3 serves as a select gate transistor SDT.

A contact plug CP2 is provided at the side of the interconnect layer WC2 for the select gate line SGSL opposite to interconnect layer WC2 for the word line WL1. One contact plug CP2 is provided on top of one fin-type structure 24. Each contact plug CP2 extends through the corresponding fin-type structure 24 to be in contact with all the semiconductor layers 23 in this fin-type structure 24. The top of each contact plug CP2 is coupled to the source line SL.

The fin-type structures 24-0 to 24-3 are coupled to each other at their ends. The top of the semiconductor layer 23-1 is coupled to a bit line BL0 via a contact plug CP10. The top of the semiconductor layer 23-2 is coupled to a bit line BL1 via a contact plug CP11. The top of the semiconductor layer 23-3 is coupled to a bit line BL2 via a contact plug CP12.

The structure illustrated in FIGS. 11 to 13 also realizes the same structure as the cell array 111 illustrated in FIG. 3. It, however, differs from the circuit diagram of FIG. 3 in the following respects. First, in the third embodiment, the select gate transistor SSTb is not provided but the select gate transistor SST is directly coupled to the source line SL. Moreover, FIGS. 11 to 13 illustrate an example of one string including four cell transistors MT. Furthermore, FIGS. 11 to 13 illustrate an example of four fingers FGR sharing the select gate line SGSL.

The application of the voltages to nodes during a read is the same as that in the first embodiment. Therefore, the third embodiment also produces the same advantages as those in the first embodiment.

Fourth Embodiment

The fourth embodiment relates to details of the sense amplifier 30 in a data circuit and the page buffer 113.

FIG. 15 is a simplified circuit diagram for describing the principle of an operation of the sense amplifier 30 according to the fourth embodiment. The sense amplifier 30 of FIG. 15 includes first and second transistors Q1 and Q2 which are cascade-coupled in a current path between a bit line BL and a SEN node (or, sense node), and a third transistor Q3 coupled between a second n2 between these first and second transistors Q1 and Q2 and an N2 node. The first transistor Q1 serves as the switch SW in FIG. 14.

Between the bit line BL and the CELSRC node, a NAND string STR of the same structure as in FIG. 3 is coupled. The gate of the third transistor Q3 is coupled to a first node n1 along with the drain of the first transistor Q1. To a current path between the first node n1 and the bit line BL, a fourth transistor Q4 is coupled. The fourth transistor Q4 is a transistor with a high withstand voltage provided in order to electrically disconnect the bit line BL and the first node n1 during, for example, a data erasure of the cell transistor MT. A PMOS transistor Q7 is provided between a VDDSA node and the first node n1.

The drain of the second transistor Q2 is the SEN node, to which one end of a capacitor C is coupled. The SEN node is a sense node which charges and discharges the capacitor C based on the logic of data read from a cell transistor MT.

Turning on and off of the first to fourth and seventh transistors Q1 to Q4 and Q7 is performed by the sequencer 140 of FIG. 2. The first to fourth transistors Q1 to Q4 are all NMOS transistors.

Figure 16:
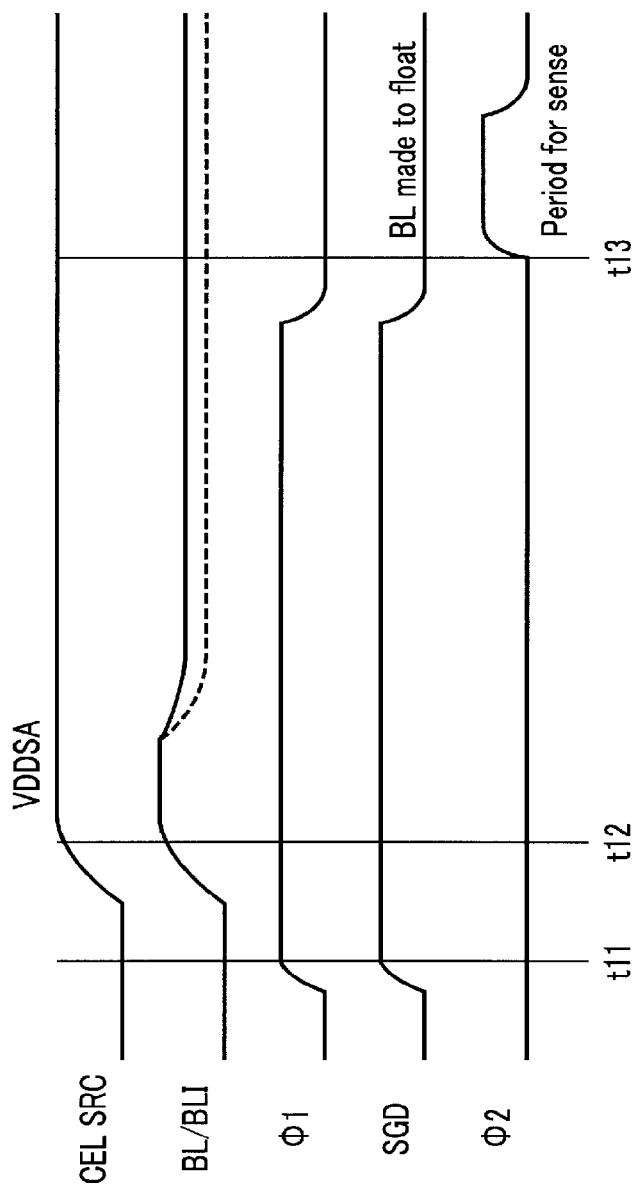
FIG. 16 illustrates a timing chart of FIG. 15.

FIG. 16 is a timing chart of FIG. 15. When a read of a cell transistor MT is performed, a gate voltage $\phi 1$ of the first transistor Q1 is first made high, and a gate voltage $\phi 2$ of the second transistor Q2 is made low (time t11). At this time, a voltage fluctuation of the second node n2 is desirably suppressed in order to suppress the drain bias dependence of the first transistor Q1. To this end, the gate voltage $\phi 1$ of the first transistor Q1 is set to the voltage of the SASRC node+the threshold voltage of the first transistor Q1+the overdrive voltage (about 0.2V). The select gate line SGDL transitions to high at time the t11. The select gate line SGSL is already being applied with the voltage for applying the bias of the diode connection to the transistor SGSL (VBL+VSRC etc.) at time the t11, as described in the first embodiment.

Then, the CELSRC node (or, source line SL) at the side of one end of the NAND string STR is raised to VDDSA (time t12). At this time, the selected word line WL in NAND string STR is being applied with the read voltage Vcgrv. With the application of the voltage Vcgrv, the selected cell transistor MT remains off if it has the threshold voltage larger than the voltage Vcgrv, and it turns on if it has the threshold voltage smaller than the voltage Vcgrv. Hereinafter, a cell transistor MT with the threshold voltage larger than the voltage Vcgrv is treated as storing data "0", and a cell transistor MT with the threshold voltage lower than the voltage Vcgrv is treated as storing data "1".

With the rising of the voltage at time 12, the voltage of the bit lines BL and BLI hardly falls when the data of the read-target cell transistor MT in the NAND string STR is "1" (solid line in FIG. 16), or greatly falls when the data is "0" (dashed line in FIG. 16).

Also at time the t12, the gate voltage $\phi 1$ of the first transistor Q1 is set at the voltage of SASRC node+the threshold voltage of the first transistor Q1+the overdrive voltage. Therefore, although the first transistor Q1 is on, the second node n2 is clamped to the voltage of the voltage of the SASRC node+the overdrive voltage, and becomes the same as or slightly lower than the voltage of the drain voltage of the first transistor Q1 (voltage of the node n1). Moreover, the first node n1 becomes the voltage according to the cell current which flows through the bit line BL. The second node n2 is higher than the voltage of the SASRC node, and the voltage of the first node n1 is applied to the gate of the third transistor Q3, and therefore the third transistor Q3 operates as a diode. Therefore, the current which flows from the CELSRC node through the NAND string STR and the bit line BL flows into the N2 node through the fourth transistor Q4, the first transistor Q1, and the third transistor Q3 in this order.

After an elapse of a certain time from the time t12, the potential of the bit line BL and the potential of the second node n2 between the first and third transistors Q1 and Q3 stabilize. In this state, the first transistor Q1 and the fourth transistor Q4 are turned off, and the gate of the second transistor Q2 is applied with the gate voltage $\phi 2$ the same as the gate voltage $\phi 1$ at the time t11 (time t13). More specifically, the gate voltage $\phi 2$ is the voltage of the SASRC node+the threshold voltage of the second transistor Q2+the overdrive voltage. With this, the second node n2 is maintained at the same voltage level as that at the time t11. With both the first transistor Q1 and the fourth transistor Q4 turned off, the first node n1 is in a high impedance state, and the first node n1 is maintained at the potential before the time t13.

By making the gate voltage $\phi 2$ of the second transistor Q2 at the time t13 the same as the gate voltage $\phi 1$ of the first transistor Q1 at the time t11, the voltage level of the node n2 is also maintained, the third transistor Q3 operates as a diode also after the time t13, and the current from the SEN node flows through the second transistor Q2 and the third transistor Q3 to the SASRC node. The potential of the bit line BL varies depending on data logic of the read target cell in the NAND string STR at the time t13. With this potential, the current which flows from the SEN node to the SASRC node after the time t13 also varies and the potential of the SEN node is determined according to the current which flowed. By sensing the potential of this SEN node, data "0" or "1" is distinguished.

Thus, before and after turning on and off the first transistor Q1 and the second transistor Q2 at time the t13, the gate voltages $\phi 1$ and $\phi 2$ of the first and second transistors Q1 and Q2 are controlled so that the potentials of the first node n1 and the second node n2 do not change. With this, even if the first and second transistors Q1 and Q2 are turned on and off, the current which flows between the drain and source of the third transistor Q3 is almost constant.

In the description above, the fourth transistor Q4 is turned off to set the first node n1 at the high impedance state when the first transistor Q1 is turned off and the second transistor Q2 is turned on; however at least one of the select gate transistors SDT and SST in the NAND string STR may be turned off instead of turning off the fourth transistor Q4.

Thus, in the fourth embodiment, during a read from a cell transistor MT, the first transistor Q1 is turned on to conduct the current from the bit line BL to the diode-connected third transistor Q3, and then after the potentials of the bit line BL and the second node n2 stabilize, the second transistor Q2 is turned on to conduct the current from the SEN node to the diode-connected third transistor Q3 to discharge the SEN node. In other words, in the present embodiment, regardless of which one of the first and second transistors Q1 and Q2 is on, the third transistor Q3 operates as a diode, and therefore the discharge current from the SEN node does not flow to the cell side. Therefore, the cell transistor MT can be read without dependence on the voltage of the CELSRC node at one side of the NAND string STR, which allows for a read by decreasing the SEN node voltage without decreasing the CELSRC node voltage which would decrease the reliability of the cell transistor MT. This in turn enables a low voltage drive without decreasing the reliability of the cell transistor MT.

Moreover, the N2 node potential can be adjusted without influencing the CELSRC node potential, and the temperature characteristics of the cell transistors MT, fluctuation of resistance of the cell current path, the variation of the threshold of the diode-connected third transistor Q3 can be adjusted by adjusting the SASRC node potential as will be described.

Fifth Embodiment

The fifth embodiment described in the following relates to a more specific version of the sense amplifier 30 of the fourth embodiment.

Figure 17:
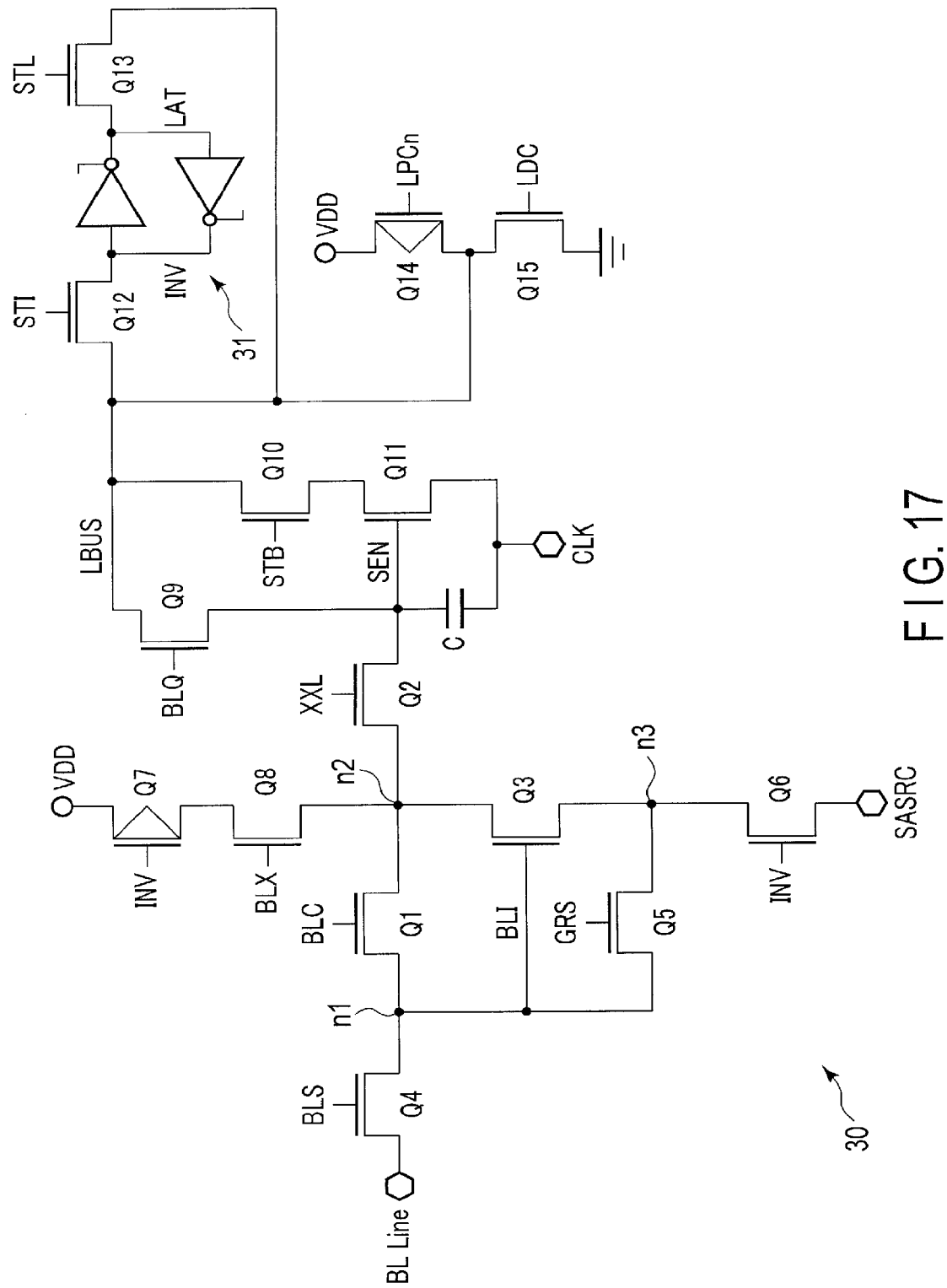
FIG. 17 illustrates a circuit diagram of a sense amplifier 30 according to the fifth embodiment.

FIG. 17 is a circuit diagram of the sense amplifier 30 according to the fifth embodiment. In FIG. 17, a transistor with the same function as that in FIG. 15 is labeled with the same sign. The sense amplifier 30 of FIG. 17 includes, in addition to the first to fourth transistors Q1 to Q4 illustrated in FIG. 15, fifth to fifteenth transistors Q5 to Q15 and a latch circuit 31.

The fifth transistor Q5 is coupled between the gate and source of the third transistor Q3. The fifth transistor Q5 is provided in order to conduct a current which flows from the bit line BL to the third node n3 without flowing through the first and second transistors Q1 and Q2 during a data write to a cell transistor MT. The fifth transistor Q5 is turned on and off by a GRS signal.

The sixth transistor Q6 is provided between the source of the third transistor Q3 and the SASRC node, and turned on and off by an INV signal. The sixth transistor Q6 serves as the switch SW of FIG. 14.

The seventh transistor Q7 and the eighth transistor Q8 are cascade-connected between the power voltage node VDD and the second node n2. The seventh transistor Q7 is turned on and off by the INV signal, and the eighth transistor Q8 is turned on and off by a BLX signal.

The ninth transistor Q9 is provided between an LBUS node and the SEN node, and turned on and off on by a BLQ signal. The tenth transistor Q10 and the eleventh transistor Q11 are cascade-connected between the LBUS node and a CLK node. The tenth transistor Q10 is turned on and off by an STB signal.

The twelfth transistor Q12 is provided between the LBUS node and the input node of the latch circuit 31, and turned on and off by an STI signal. The thirteenth transistor Q13 is provided between the LBUS node and the output node of the latch circuit 31, and turned on and off by an STL signal.

The fourteenth transistor Q14 and the fifteenth transistor Q15 are cascade-connected between the power voltage node VDD and the ground node. The fourteenth transistor Q14 and the fifteenth transistor Q15 operate as a lockout controller which forcibly inverts the logic of the data latched in the latch circuit 31 upon a lockout as will be described. The fourteenth transistor Q14 is turned on and off by an LPCn signal, and the fifteenth transistor Q15 is turned on and off by an LDC signal.

The seventh transistor Q7 and the fourteenth transistor Q14 are PMOS transistors, and other transistors are NMOS transistors.

The INV signal input to the gates of the sixth and seventh transistors Q6 and Q7 is a signal of the same logic as the latched data INV of the latch circuit 31.

FIG. 17 illustrates an example in which the gate of the first transistor Q1 is supplied with a BLC signal, the gate of the second transistor Q2 an XXL signal, the gate of the third transistor Q3 a BLI signal, the gate of the fourth transistor Q4 a BLS signal, and the gate of the fifth transistor Q5 a GRS signal. The BLC signal is equivalent to the φ1 signal of FIG. 15, and the XXL signal is equivalent to the φ2 signal.

Figure 18:
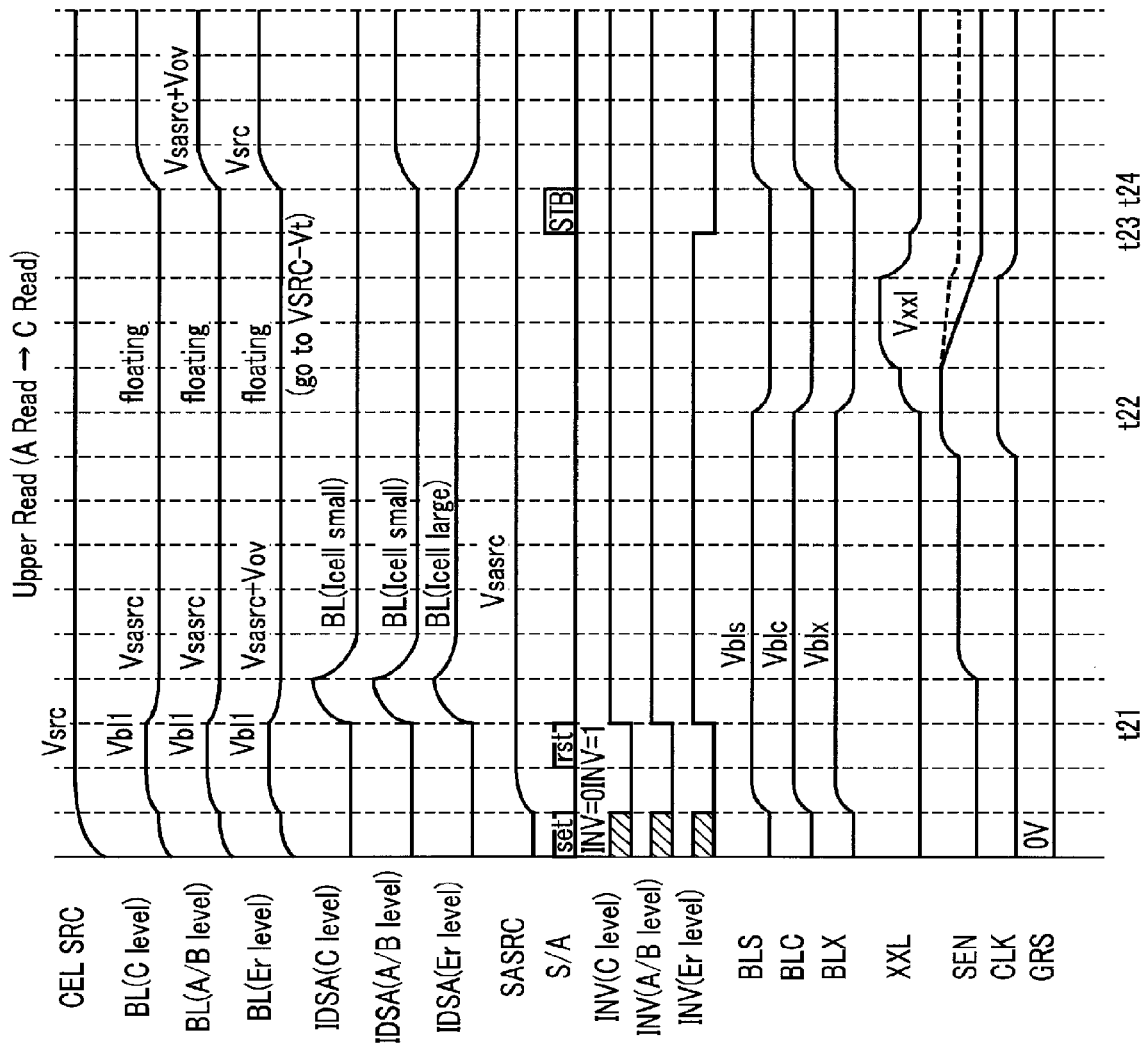
FIG. 18 illustrates an operation timing chart for a case with a lockout operation.
Figure 19:
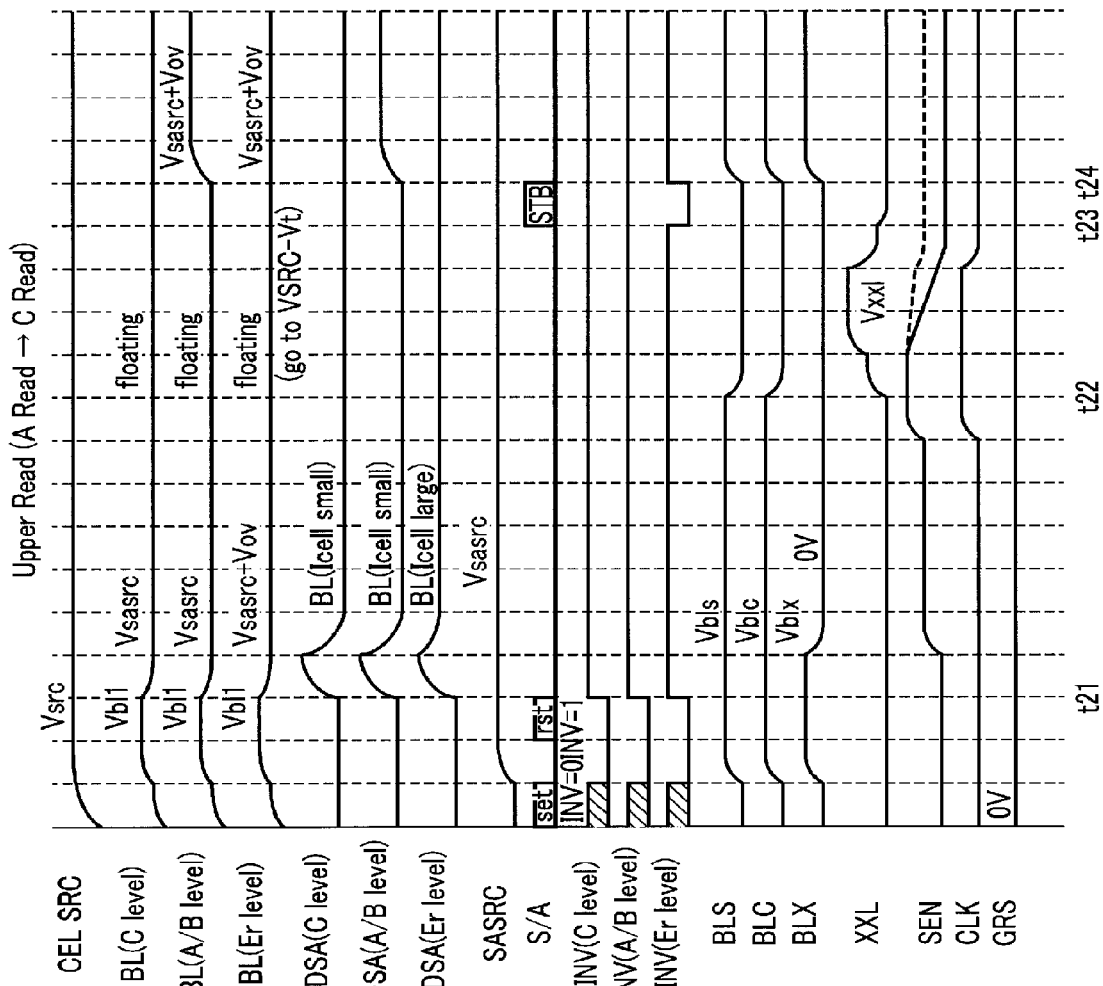
FIG. 19 illustrates an operation timing chart for a case without the lockout operation.

FIGS. 18 and 19 are the timing charts illustrating the operation timing of the sense amplifier 30 of FIG. 17. FIG. 18 illustrates the operation timing for a case of performing a lockout operation which blocks flow of a read current after valid data is read from the cell transistors MT, and FIG. 19 illustrates the operation timing for a case without the lockout operation. Whether lockout operation is performed in the sense amplifier 30 of FIG. 17 can be selected.

The timing charts of FIGS. 18 and 19 illustrate an operation timing for a case for reading the cell transistors MT into which a multiple-level write has been performed. For example, a reading of a cell transistor MT with four-level data written is divided into an upper read and a lower read, and FIGS. 18 and 19 illustrate the operation timing for the upper read.

In the timing charts of FIGS. 18 and 19, IDSA (C level), IDSA (A/B level) and IDSA (Er level) indicate waveforms of currents which flow between the drain and source of the diode-connected third transistor Q3 during reads of the C level, the A/B level, and Er level of the cell transistor MT, respectively. The remaining signal waveforms of FIGS. 18 and 19 are voltage waveforms.

The INV signal transitions from low to high at the time t21 of FIG. 18. At this time, each of the CELSRC node, the BLS signal, the BLS signal, and the BLX signal have a high voltage. With this, a current flows from the CELSRC node into the SASRC node through the NAND string STR, the fourth transistor Q4, the first transistor Q1, the third transistor Q3, and the sixth transistor Q6 in this order, and the potentials of the bit line BL and the second node n2 stabilize soon. The potentials of the bit line BL and the second node n2 become the potentials according to the data logic of the read target cell in the NAND string STR, as mentioned above.

When the BLS signal, the BLC signal, and the BLX signal become low and the XXL signal become high at the time t22, a current flows from the SEN node to the N2 node through the second transistor Q2, the third transistor Q3, and the sixth transistor Q6.

With this, the SEN node becomes the potential according to the potential of the second node n2 just before the time t22, as illustrated with the broken line or alternate long and short dash line in FIG. 18. The latch circuit 31 latches the data of the logic according to the potential of the SEN node from the time t23 to the time t24.

Figure 20:
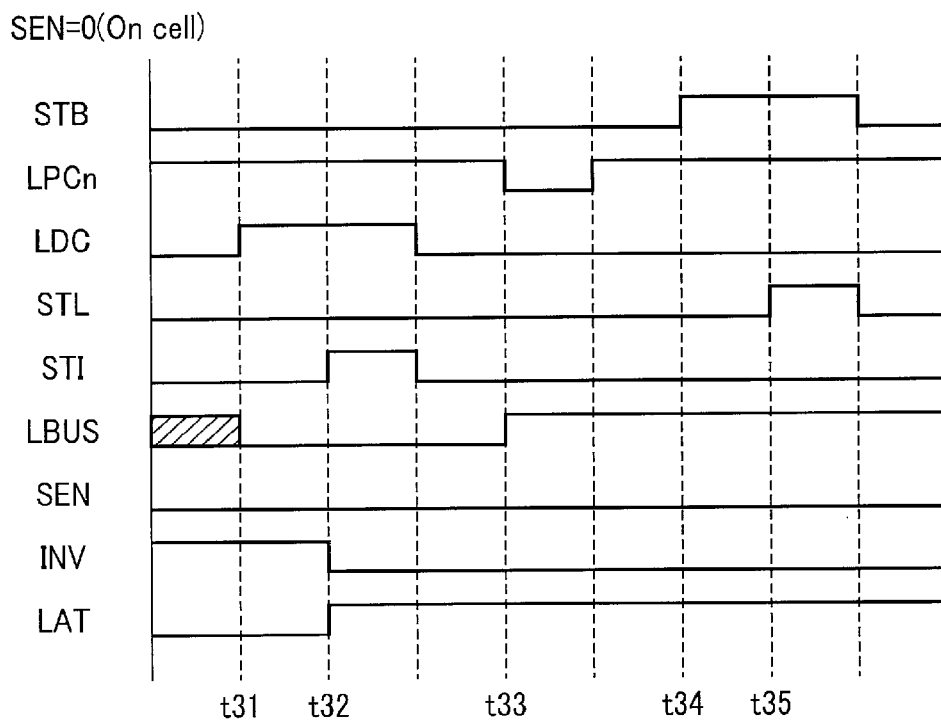
FIG. 20 illustrates a detailed timing chart of the period from t13 to t14 of FIG. 18.
Figure 20:
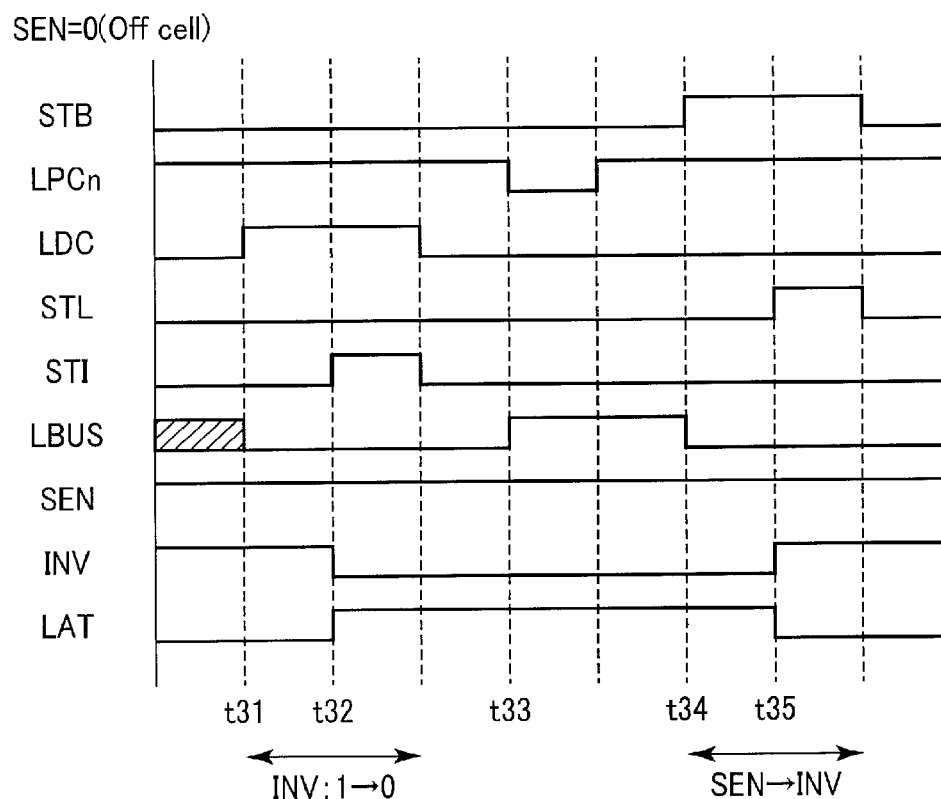

FIG. 20 is the detailed timing chart of the period from time the t23 to t24 of FIG. 18. The timing chart of FIG. 20(a) illustrates the operation timing for a case in which the SEN node is at the low potential, or the data read from a cell transistor MT is "0", and the timing chart of FIG. 20(b) illustrates the operation timing for a case in which the SEN node is at the high potential.

When the LDC signal becomes high at the time t31 of FIG. 20(a), the fifteenth transistor Q15 turns on and the LBUS node becomes low. Then, when the STI signal becomes high at the time t32, the twelfth transistor Q12 turns on and the input node INV of the latch circuit 31 becomes the same low potential as the SEN node. The input node INV of the latch circuit 31 is electrically conductive with the INV signal illustrated in FIG. 17.

Originally, when the SEN node is at a low potential, the eleventh transistor Q11 is off and the LBUS node is still at a high potential. In the present embodiment, after valid data is read, the lockout operation in which the INV signal is made low to avoid the current from the SEN node from flowing to the N2 node is performed. To this end, the INV signal is made low at the time t32.

Incidentally, since the latch circuit 31 consists of clocked inverters coupled in an anti-parallel manner and outputs the latched data with its logic inverted, the logic at the LBUS node and the logic of the output node of the latch circuit 31 need to be the same before the time t35 at which the thirteenth transistor Q13 is turned on in order to avoid different logic signals from colliding. To this end, at the time t33, the LPCn signal is made low to make the LBUS node high from low.

Since valid read is not yet performed from the cell transistor MT when the SEN node is at a high potential, the INV signal is made low at the time t32 and then made back to high at the time t35 as illustrated in FIG. 20(*b*).

If the operation timings of FIGS. 18 and 19 are compared, after the potential according to the logic of the data read from the cell transistor MT is set at the SEN node, FIGS. 18 and 19 differ in operation timing between the time t23 and t24 in which the potential of the SEN node is written in the latch circuit 31 and thereafter. When the lockout operation is not performed, in order to make the INV signal high at the time t24 as illustrated in FIG. 19, the sixth transistor Q6 is turned on to allow the current from the bit line BL or the SEN node to keep flowing to the N2 node through the sixth transistor Q6.

The sense amplifier 30 of FIG. 17 can read the cell transistors MT by not only the sense method as in FIGS. 18 to 20 (to be referred to as a new sense method), but by the existing ABL method.

Figure 21:
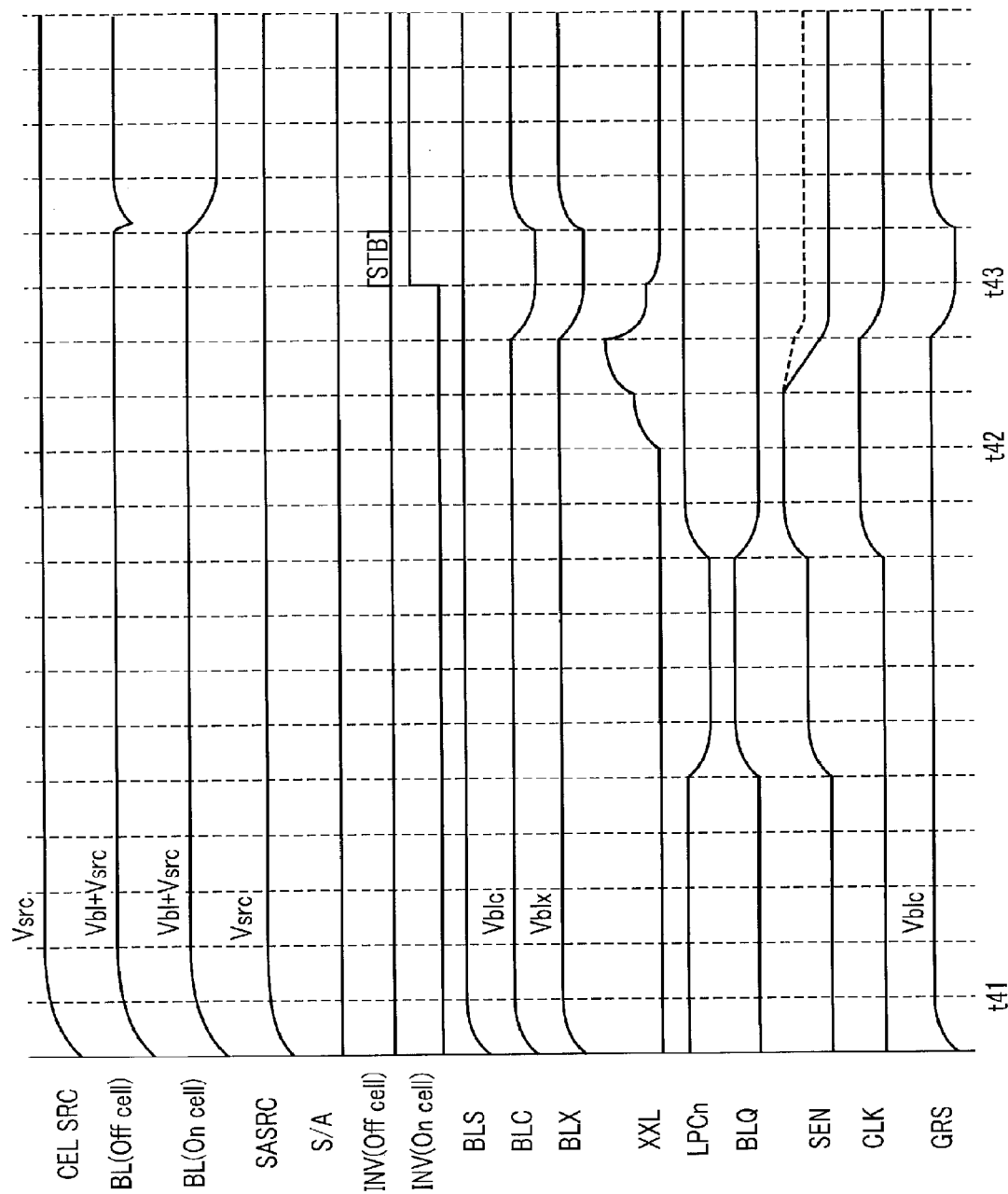
FIG. 21 illustrates an operation timing chart for a case of performing a read from the memory cell transistors MT with an ABL method.

FIG. 21 is an operation timing chart for a case of reading the cell transistors MT by the ABL method. With the ABL method, all the bit lines BL are first precharged (the time t41 to t42). In this period, the INV signal is low. Therefore, a current flows through the seventh transistor Q7, the eighth transistor Q8, the first transistor Q1, and the fourth transistor Q4 in this order to each bit line BL.

The potential level of the XXL signal is raised at the time t42 to turn on the second transistor Q2. With this, the current from the SEN node flows through the second transistor Q2, the first transistor Q1, and the fourth transistor Q4 to the bit line BL. The amount of the current flowing varies according to the potential of the bit line BL just before the time t42, and, in turn, the potential of the SEN node becomes the potential level according to the data of the read target cell transistor MT.

Then, although the INV signal becomes high at the time t43, the level of the XXL signal is discharged to 0V, and therefore a current does not flow to the N2 node from the SEN node.

Figure 22:
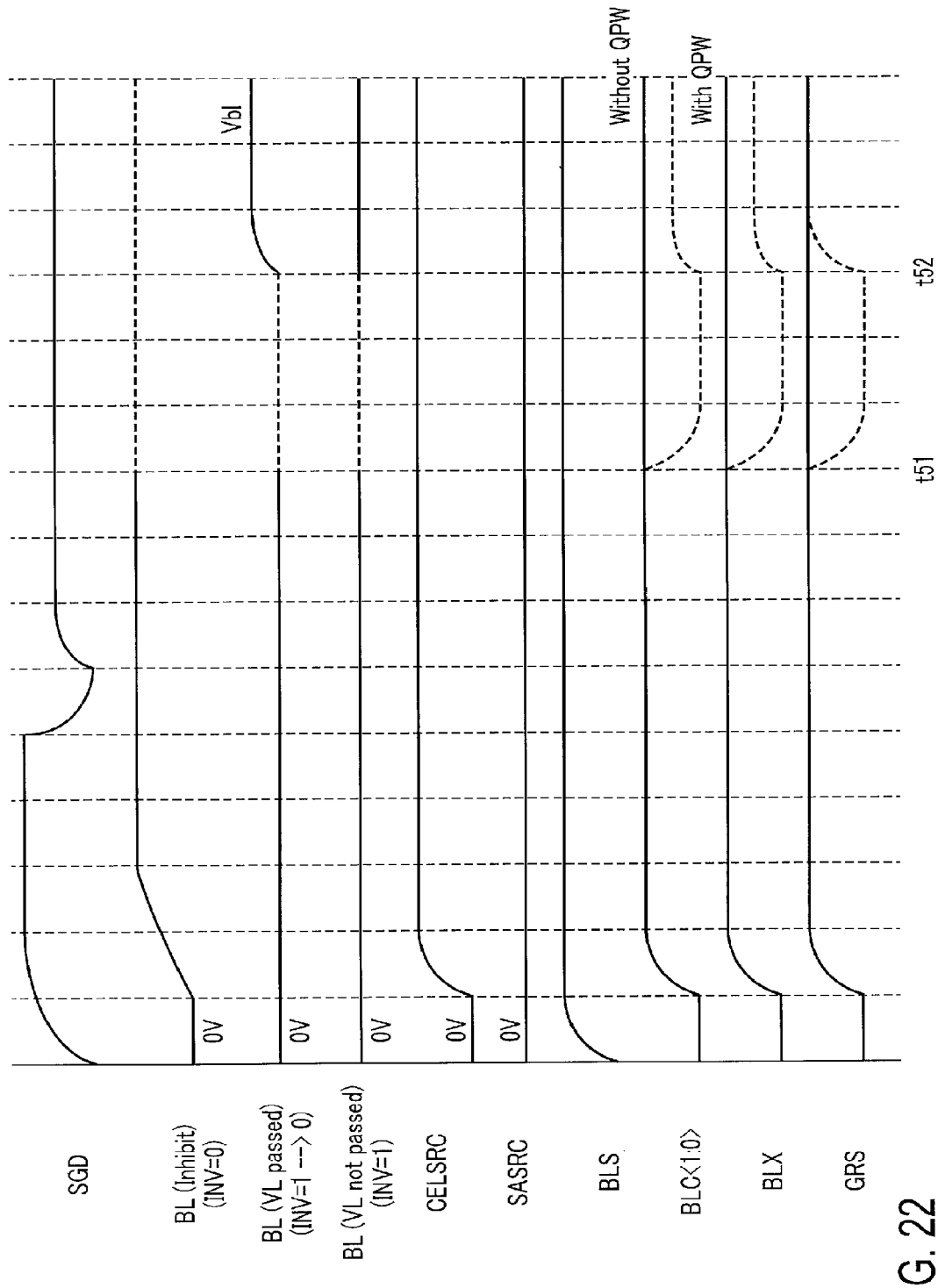
FIG. 22 illustrates an operation timing chart for a case of performing a write to the memory cell transistors MT with the sense amplifier 30 of FIG. 17.

FIG. 22 is an operation timing chart for a case in which a write (program) to the cell transistors MT is performed using the sense amplifier 30 of FIG. 17. The sense amplifier 30 of FIG. 17 can also perform a quick pass write (QPW) if needed. FIG. 22 illustrates voltage waveforms of three bit lines BL of a bit line BL to which QPW is performed (VLpassed), a bit line BL to which the QPW is not performed (VLnotpassed), and a bit line BL which is not subjected to a write (inhibit). SGD is the gate voltage waveform of the select gate transistors in the NAND string STR.

Since the write voltage applied to the write target cell transistors MT is increased gradually in the QPW, after the BLC signal, the BLX signal, and the GRS signal fall greatly (time t51) and then are raised (time t52) as illustrated with the dashed lines in FIG. 22. According to this, the voltage of the bit line BL (VLpassed) is also raised.

A sense method in which the cell transistors MT are read separately for the even bit lines BL and odd bit lines BL can also be used for the sense amplifier 30 of FIG. 17.

Figure 23:
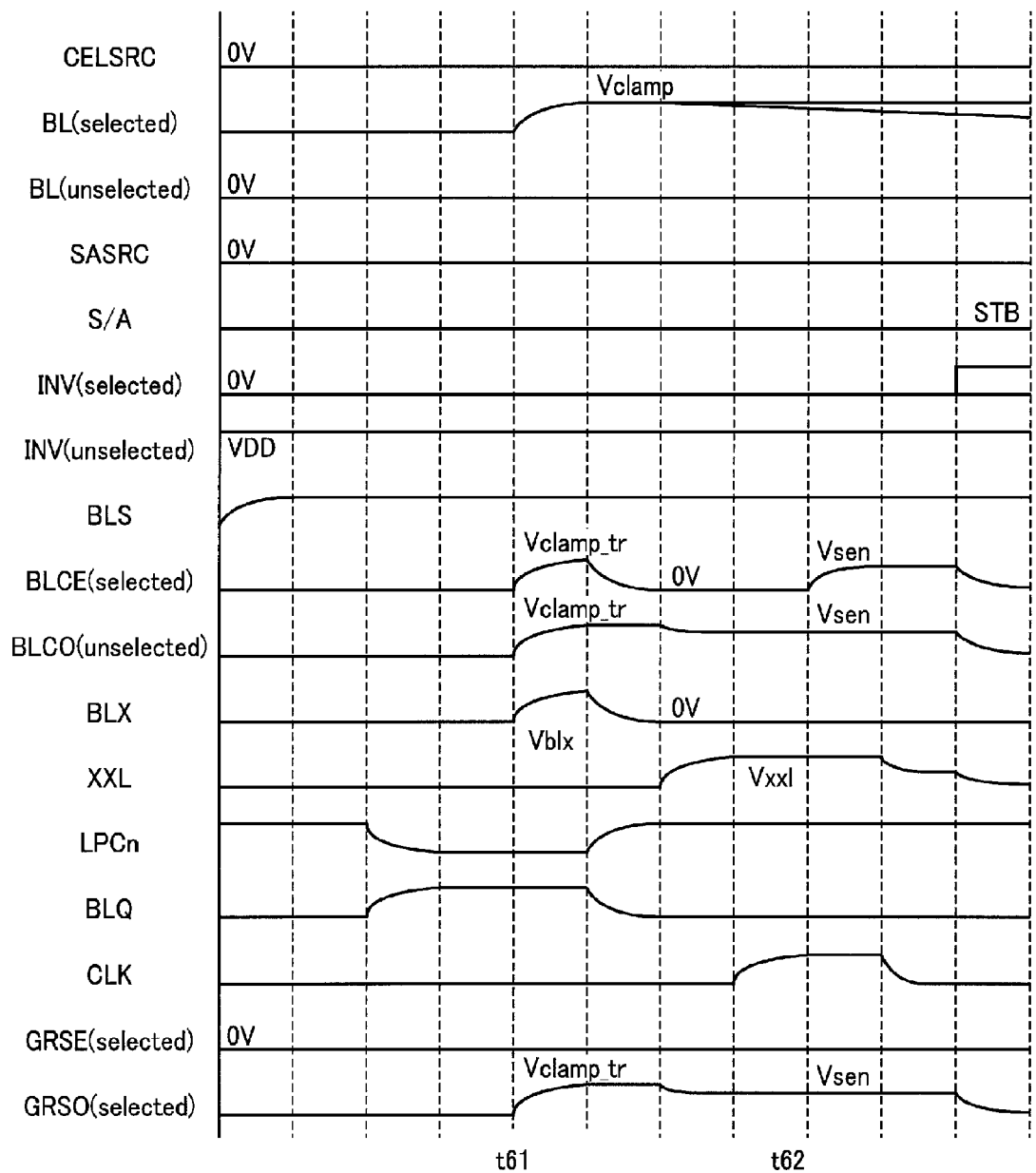
FIG. 23 illustrates an operation timing chart for a case of performing a read from the memory cell transistors MT for even bit lines EL and odd bit lines BL separately with the sense amplifier 30 of FIG. 17.

FIG. 23 is an operation timing chart for a case in which the cell transistors MT are read separately for even bit lines BL and odd bit lines BL using the sense amplifier 30 of FIG. 17. In FIG. 23, the gate signals of the first transistors Q1 corresponding to the even and odd bit lines are indicated as BLCE and BLO, respectively. Similarly, the gate signals of the fifth transistors Q5 corresponding to the even and odd bit lines are indicated as GRSE and GRSO, respectively. The timing chart of FIG. 23 illustrates the operation timing for a case in which the even bit lines BL are selected and the odd bit lines BL are not selected. After all the bit lines BL are clamped to a predetermined voltage at the time t61, the even bit lines BL for which the read is performed are set as the potentials according to the read target cells in the NAND strings STR, and the odd bit lines BL are maintained as the clamped voltage (time t62). The odd bit lines BL are clamped while the read is performed for the even bit lines BL, and the even bit lines BL are clamped while the read is performed for the odd bit lines BL as in FIG. 23, which allows the potential of the bit lines BL to be sensed without being affected by the influence of the potential fluctuation of adjacent bit lines BL. This can improve the read accuracy of data.

The memory controller 200 illustrated in FIG. 1 can select which one of the new sense method and the lockout operation illustrated in FIGS. 18 to 20, the ABL sense method illustrated in FIG. 21, the QPW illustrated in FIG. 22, and the sense method illustrated in FIG. 23 is used.

As described, the sense amplifier 30 according to the fifth embodiment has the same first to fourth transistors Q1 to Q4 as the fourth embodiment, and therefore the same advantages as those of the fourth embodiment can be obtained. Moreover, the sense amplifier 30 according to the present embodiment can use the new sense method in which a current flows from the SEN node through the diode-connected third transistor Q3 to the SASRC node, and the existing ABL method. Furthermore, it can be selected whether the lockout operation is performed after valid data is read from the cell transistor MT. Furthermore, whether the QPW is performed can be selected. Moreover, the sense method in which data read is performed separately for the even bit lines BL and the odd bit lines BL can be used.

Sixth Embodiment

The sense amplifier 30 of FIG. 17 includes the sixth transistor Q6 provided between the second node n2 and the SASRC node in order to perform the lockout operation; however a circuit structure different from that in FIG. 17 can be used when the lockout operation does not need to be performed.

FIG. 24 is a circuit diagram of the sense amplifier 30 according to the sixth embodiment. In FIG. 24, a component which is common with that in FIG. 17 is indicated with the same sign, and description will be given of mainly differences. The sense amplifier 30 of FIG. 24 differs from that in FIG. 17 in how the third transistor Q3, the fifth transistor Q5, and the sixth transistor Q6 are connected.

In FIG. 24, the fifth transistor Q5 and the third transistor Q3 are cascade-connected between the second node n2 and the SASRC node. The sixth transistor Q6 is provided between the second node n2 and the SASRC node. The fifth transistor Q5 serves as the switch SW of FIG. 14.

In FIG. 17 the GRS signal input to the gate of the fifth transistor Q5 is low during the read and high during the write, whereas in FIG. 24 the GRS signal is high during the read and low during the write. Therefore, the third transistor Q3 operates as a diode during the read, and is disconnected from the first node n1 during the write.

In the FIG. 24 case, when the INV signal becomes low, the sixth transistor Q6 turns off; however the current from the SEN node flows to the SASRC node through the fifth transistor Q5 and the diode-connected third transistor Q3. Therefore, the lockout operation cannot be performed.

As described, the sense amplifier 30 according to the sixth embodiment cannot perform the lockout operation, but, except for that, the same advantages as those of the fifth embodiment can be obtained.

Seventh Embodiment

The sense amplifier 30 illustrated in FIG. 17 or FIG. 24 switches and performs the new sense method in which the current flows from the SEN node to the SASRC node and the existing ABL method in which the current flows from the SEN node to the bit line BL side during the read as mentioned above, and this switching control may be performed by the sequencer 140 in the semiconductor memory device 100 of FIG. 2, or the memory controller 200 provided separately from the memory device 100.

FIG. 25 is a schematic block diagram of the memory system 1 which includes the memory controller 200 and the semiconductor memory device 100. In response to instructions from the processor (or, a host device) 43, the memory controller 200 accesses the semiconductor memory device 100 to perform data writes and reads. The memory controller 200 can switch the sense methods of the sense amplifier 30 as described above.

As techniques of instructing the switching of the sense method, an instruction with a prefix command, an instruction by a Set Feature command sequence, and an instruction with a parameter set are possible, for example. Another method for instruction can also be used.

FIG. 26 is a schematic timing chart for a case of the instruction by a prefix command. FIG. 26 illustrates an example for switching the sense method between the A-level read and the C-level read for a case of reading data of the cell transistor MT with multiple levels written.

For a case of the instruction with the prefix command, the new sense method is used for the A-level, and the ABL sense method for the C-level, for example. For a case without the instruction with the prefix command, the new sense method is used for both the A-level and C-level.

The memory controller 200 transmits an external prefix command, a read command 00h, a read address, and a read command 30h in this order to the semiconductor memory device 100 through, for example, an I/O bus, as illustrated in FIG. 27. The sequencer 140 in the semiconductor memory device 100 interprets the external prefix command, and selects the ABL sense or the new sense method.

As described, in the seventh embodiment, the sense method of the sense amplifier 30 can be switched from the outside of the semiconductor memory device 100, which makes it easy to learn the operation of the sense amplifier 30.

Eighth Embodiment

The sense amplifier 30, such as that in FIG. 17, includes the N2 node at the source side of the diode-connected third transistor Q3. Adjusting the voltage of the SASRC node can adjust the voltage of the bit line BL. The purpose of adjusting the voltage of the bit line BL is, for example, 1) to adjust the cell current, 2) to offset the variation of the resistance of the cell current path, and 3) to cancel the variation of the diode-connected third transistor Q3.

FIG. 28 is a circuit diagram illustrating an example of a voltage adjuster 51 which adjusts the voltage of the SASRC node. The voltage adjuster 51 of FIG. 28 has a transistor 52 provided between the SASRC node and the ground node, and a comparator 53 for adjusting the gate voltage of the transistor 52. The comparator 53 compares the voltage of the SASRC node with a reference voltage Vref, and it decreases the gate voltage of the transistor 52 when the voltage of the SASRC node is higher and increases the gate voltage of the transistor 52 when the voltage of the SASRC node is lower.

1) In general, the higher the environment temperature, the lower the threshold of the cell transistors MT. The lower the threshold of the cell transistor MT, the easier the current flows from the CELSRC node through the NAND string STR to the bit line BL to increase the voltage of the bit line BL. In this case, an increased voltage of the SASRC node makes it difficult for the current to flow between the drain and source of the diode-connected third transistor Q3, which can suppress the amount of the current which flows through the bit line BL. Therefore, when the environment temperature is high, the circuit of FIG. 28 is used to set the SASRC node high.

2) The longer the distance from the NAND string STR to the sense amplifier 30, the larger the influence of the resistance of the bit line BL. Specifically, the resistance of a path of the cell current which flows through the bit line BL is high, which results in a low voltage of the bit line BL. To address this, when the data of a cell transistor MT in a cell block far from the sense amplifier 30 is used, for example the circuit in FIG. 28, this decreases the voltage of the SASRC node to increase the current which flows through the bit line BL.

3) The diode connected third transistors Q3 have a variation in threshold. A low threshold allows a large current to flow from the bit line BL to the third transistor Q3, and therefore in this case the circuit of FIG. 28 is used to set the SASRC node high. In contrast, a high threshold suppresses the flow of the current from the bit line BL to the third transistor Q3, and therefore in this case the SASRC node is made low.

FIG. 28 illustrates an example in which the SASRC node is coupled to the circuit for adjusting its voltage, but this circuit may be coupled to the third node n3 between the third transistors Q3 and the sixth transistor Q6 of, for example, FIG. 17.

As described, in the eighth embodiment, the circuit for adjusting the voltage of the SASRC node is provided, which can offset the variation in the cell currents caused by the temperature, variation in resistance of the cell current paths, and the variation in threshold of the diode-connected third transistors Q3. This allows stable currents to flow through the bit lines BL to improve the reliability of the data read.

Ninth Embodiment

As described in the eighth embodiment, the voltages of the SASRC nodes may vary due to 1) the environment temperature, 2) the distances from the NAND strings STR to the sense amplifier 30, and 3) the threshold variation of the diode-connected third transistors Q3. Therefore, the reference voltage Vref compared with the voltage of the SASRC node with the comparator 53 of FIG. 28 also needs to be adjusted with the above 1) to 3) taken into consideration. Specifically, when the voltage of a SASRC node changes due to the above 1) to 3), the reference voltage Vref is also desirably changed by 1) to 3). Based on this, the ninth embodiment described in the following is characterized by adding the reference voltage generator for generating the reference voltage Vref to the voltage adjuster 51 of FIG. 28. This reference voltage generator adjusts the reference voltage Vref with the above 1) to 3) taken into consideration.

This reference voltage generator does not need to be provided for each sense amplifier 30, but can be shared by plural sense amplifiers 30. For example, a reference voltage generator may be provided for each memory bank. In this case, for comparison for all the SASRC nodes in one memory bank, the reference voltage Vref generated in the corresponding reference voltage generator is used.

FIG. 29 is a circuit diagram illustrating an example of the reference voltage generator 61. The reference voltage generator 61 of FIG. 29 has a current source 62, a resistance replica part 63, a diode replica part 64, and a feedback controller 65. In FIG. 29, the diode-connected transistors Q3, such as that in FIG. 15, is illustrated as a current source Q3.

The current source 62 generates a current according to a current which flows to the read target NAND string STR. The current source 62 does not necessarily need to be provided in the reference voltage generator 61, but only needs to be provided in the semiconductor memory device 100. The current generated by the current source 62 is set in advance. More specifically, the current generated by the current source 62 is ideally set as the current of the boundary over which the sense amplifier 30 determines a cell transistor in the NAND string STR to be an on-cell. As described, the higher the environment temperature, generally the higher the threshold of the cell transistor MT and higher the cell current flowing through the NAND string STR. Therefore, according to the environment temperature, the current output from the current source 62 may be controlled. Alternatively, during designing the reference voltage generator 61 of FIG. 29, an environment temperature is assumed in advance and based on the assumed temperature the current value output from the current source 62 as a fixed value.

The resistance replica part 63 is coupled to the current path of the current source 62, and has a resistance according to the resistance of the bit line. Specifically, the resistance replica part 63 has a resistance corresponding to the resistance of the bit line BL when a read current flows from the read target NAND string STR to the bit line BL. The resistance of a bit line varies with the distance of the NAND string STR and the sense amplifier 30, and therefore the resistance of the resistance replica part 63 is desirably adjusted based on which NAND string STR is a target for a read. The adjustment of the resistance unit of the resistance replica part 63 is performed by, for example, the sequencer 140 illustrated in FIG. 2. Finely adjusting the resistance of the resistance replica part 63 according to the distance of a NAND string STR in the semiconductor memory device 100 and the sense amplifier 30 poses a heavy process burden on the sequencer 140. Therefore, plural resistances of the resistance replica part 63 are prepared in advance, and one may be selected from them.

The diode replica part 64 is coupled between one end of the resistance replica part 63 and the output node n0 of the reference voltage Vref, and is a transistor which imitates the electrical properties of the third transistor Q3. The third transistor Q3 is provided for each SEN node, and therefore many third transistors Q3 are provided in the semiconductor memory device 100. The third transistors Q3 have variation in electrical properties, and therefore the diode replica part 64 may be parallel-connected plural transistors which are formed by the same design criteria as the third transistor Q3. Connecting plural transistors in parallel can equalize the variation in the electrical properties of the transistors, and differences between the transistors and the third transistor Q3 in electrical properties can be reduced. When the diode replica part 64 is configured with plural transistors, the current flowing from the current source 62 also needs to be adjusted according to the number of transistors.

Although the third transistors Q3 have threshold variation and variation due to temperature characteristics, they can be offset by parallel-connecting the transistors formed by the same design criteria as the third transistors Q3 to make the diode replica part 64 as described above.

The feedback controller 65 has a comparator 66, a PMOS transistor 67, and an NMOS transistor 68. The comparator 66 compares the voltage of the connection node of the current source 62 and the resistance replica part 63 with a predetermined threshold voltage VREF_SRC to output a binary signal which indicates the relation of the magnitudes of the two voltages. This binary signal is input to the gate of the PMOS transistor 67. The PMOS transistor 67 and the NMOS transistor 68 are cascade-connected between the power voltage node and the ground node, the drains of both transistors serve as the output node n0 of the reference voltage generator 61, and this output node n0 outputs the reference voltage Vref. The output node n0 of the reference voltage generator 61 is coupled also to the source of the diode replica part 64, and thereby feedback control is performed so that the voltage of the connection node of the current source 62 and the resistance replica part 63 is matched to the predetermined threshold voltage VREF_SRC.

The reason why the comparator 66 performs the feedback control of the voltage of the connection node of the current source 62 and the resistance replica part 63 is that the voltage of this connection node corresponds to the bit line voltage of the read target NAND string STR. The reference voltage generator 61 of FIG. 29 monitors the bit line voltage of the read target NAND string STR to perform a process equivalent to generation of the reference voltage Vref.

The bit line voltage of the read target NAND string STR varies due to the temperature characteristics of the NAND string STR. Therefore, the threshold voltage VREF_SRC is desirably set with the temperature characteristics of the NAND string STR taken into consideration. The threshold voltage VREF_SRC does not need to be changed once set; however it may be changed according to the temperature detected with, for example, a temperature sensor.

As described, in the ninth embodiment, the reference voltage generator 61 which has a current path similar to that from the NAND string STR to the SASRC node through the bit line BL and the third transistor Q3 generates the reference voltage Vref used as the reference for adjusting the voltage of the SASRC node. This allows for accurate control of the voltage of the SASRC node. More specifically, the reference voltage Vref is generated with 1) the environment temperature, 2) the distance from the NAND string STR to the sense amplifier 30, and 3) the threshold variation of the diode-connected third transistors Q3 taken into consideration. This can keep the difference voltage between the reference voltage Vref and the voltage of the SASRC node which may vary due to 1) to 3) from being affected by 1) to 3). With this, the voltage of the SASRC node can be adjusted accurately according to the reference voltage Vref, without being affected by the influence of 1) to 3).

The following features is applicable to the embodiments.

In the multi-level read operation, the voltage applied to the word line selected for the "A"-level read operation may be, for example, 0 V to 0.55 V. The voltage is not limited thereto, and may be 0.1 V to 0.24 V, 0.21 V to 0.31 V, 0.31 V to 0.4 V, 0.4 V to 0.5 V, or 0.5 V to 0.55 V.

The voltage applied to the word line selected for the "B"-level read operation is, for example, 1.5 V to 2.3 V. The voltage is not limited thereto, and may be 1.75 V to 1.8 V, 1.8 V to 1.95 V, 1.95 V to 2.1 V, or 2.1 V to 2.3 V.

The voltage applied to the word line selected for the "C"-level read operation is, for example, 3.0 V to 4.0 V. The voltage is not limited thereto, and may be 3.0 V to 3.2 V, 3.2 V to 3.4 V, 3.4 V to 3.5 V, 3.7 V to 3.7 V, or 3.6 V to 4.0 V.

The time (tR) for the read operation may be, for example, 25 μs to 38 μs, 38 μs to 70 μs, or 70 μs to 80 μs.

The write operation includes the program operation and the verification operation as described above. In the write operation, the voltage first applied to the word line selected for the program operation may be, for example, 13.7 V to 14.3 V. The voltage is not limited thereto, and may be 13.7 V to 14.0 V or 14.0 V to 14.6 V.

The voltage first applied to the selected word line in the writing into an odd word line, and the voltage first applied to the selected word line in the writing into an even word line may be different.

When the program operation is of an incremental step pulse program (ISPP) type, a step-up voltage is, for example, about 0.5.

The voltage applied to the unselected word lines may be, for example, 7.0 V to 7.3 V. The voltage is not limited thereto, and may be, for example, 7.3 V to 8.4 V or may be 7.0 V or less.

The pass voltage to be applied may be changed depending on whether the unselected word line is an odd word line or an even word line.

The time (tProg) for the write operation may be, for example, 1700 μs to 1800 μs, 1800 μs to 1900 μs, or 1900 μs to 2000 μs.

In the erase operation, the voltage first applied to a well which is formed on the semiconductor substrate and over which the memory cells are arranged may be, for example, 12 V to 13.6 V. The voltage is not limited thereto, and may be, for example, 13.6 V to 14.8 V, 14.8 V to 19.0 V, 19.0 to 19.8 V, 19.8 V to 21 V.

The time (tErase) for the erase operation may be, for example, 3000 μs to 4000 μs, 4000 μs to 5000 μs, or 4000 μs to 9000 μs.

The structure of the memory cell may have the charge storage layer disposed on the semiconductor substrate (silicon substrate) via a tunnel insulating film of a thickness of 4 to 10 nm. This charge storage layer may have a stacked structure including an insulating film of SiN or SiON of a thickness of 2 to 3 nm and polysilicon of a thickness of 3 to 8 nm. A metal such as Ru may be added to polysilicon. An insulating film is provided on the charge storage layer. This insulating film has, for example, a silicon oxide film of a thickness of 4 to 10 nm intervening between a lower high-k film of a thickness of 3 to 10 nm and an upper high-k film of a thickness of 3 to 10 nm. The high-k film includes, for example, HfO. The silicon oxide film can be greater in thickness than the high-k film. A control electrode of a thickness of 30 to 70 nm is formed on the insulating film with via a material for work function adjustment of a thickness of 3 to 10 nm. Here, the material for work function adjustment includes a metal oxide film such as TaO or a metal nitride film such as TaN. W, for example, can be used for the control electrode.

An air gap can be formed between the memory cells.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first string comprising a first transistor serially-coupled to a source line, and first cell transistors serially-coupled between the first transistor and a bit line; and
   a second string comprising a second transistor serially-coupled to the source line, and second cell transistors serially-coupled between the second transistor and the bit line;
   wherein during a read, a gate of the second transistor is applied with a voltage to turn off the second transistor, and when voltages are applied to the first cell transistors, the gate of the second transistor is applied with a voltage substantially the same as a voltage applied to the source line.

2. The device of claim 1, wherein
   the first string further comprises a third transistor,
   the second string further comprises a fourth transistor, and
   during the read, a gate of the third transistor is applied with a voltage higher than a voltage applied to a gate of the fourth transistor.

3. The device of claim 2, wherein
   the first cell transistors are coupled between the first transistor and the third transistor, and
   the second cell transistors are coupled between the second transistor and the fourth transistor.

4. The device of claim 1, wherein
   during a read, a gate of the first transistor is applied with a voltage to turn off the second transistor.

5. The device of claim 1, wherein
   during the read, a gate of the second transistor is applied with a voltage to turn off the second transistor in a first phase, a pass voltage is applied to the first memory cell transistors in the first phase, the gate of the second transistor is applied with a voltage substantially the same as a voltage applied to the source line in a second phase after the first phase, a read voltage is applied to one of the first memory cell transistors in the second phase.

6. The device of claim 1, wherein the voltages include a first voltage and a second voltage which is higher than the first voltage, and the first voltage is positive voltage.

7. The device of claim 1, wherein the voltages include a read voltage.

8. A semiconductor memory device comprising:
a first string comprising a first transistor serially-coupled to a source line, and first cell transistors serially-coupled between the first transistor and a bit line; and
a second string comprising a second transistor serially-coupled to the source line, and second cell transistors serially-coupled between the second transistor and the bit line;
wherein after start of voltages to gates of the first cell transistors, a gate of the second transistor is applied with a voltage substantially the same as the voltage applied to the source line.

9. The device of claim 8, wherein
the first string further comprises a third transistor,
the second string further comprises a fourth transistor, and
during the read, a gate of the third transistor is applied with a voltage higher than a voltage applied to a gate of the fourth transistor.

10. The device of claim 9, wherein
the first cell transistors are coupled between the first transistor and the third transistor, and
the second cell transistors are coupled between the second transistor and the fourth transistor.

11. The device of claim 10, wherein
during a read, a gate of the first transistor is applied with a voltage to turn off the second transistor.

12. The device of claim 11, wherein
during the read, a gate of the second transistor is applied with a voltage to turn off the second transistor in a first phase, a pass voltage is applied to the first memory cell transistors in the first phase, the gate of the second transistor is applied with a voltage substantially the same as a voltage applied to the source line in a second phase after the first phase, a read voltage is applied to one of the first memory cell transistors in the second phase.

13. The device of claim 8, wherein the voltages include a read voltage applied during a read cycle.

14. A semiconductor memory device comprising:
a first string comprising a first transistor serially-coupled to a source line, and first cell transistors serially-coupled between the first transistor and a bit line; and
a second string comprising a second transistor serially-coupled to the source line, and second cell transistors serially-coupled between the second transistor and the bit line, a gate of the first transistor being coupled to a gate of the second transistor;
a fourth transistor electrically coupled between the bit line and a first node;
a fifth transistor electrically coupled between the first node and a second node; and
a sixth transistor having a gate electrically coupled to the bit line and coupled between the first node and a third node.

15. The device of claim 14, wherein
the second node is electrically coupled to a latch circuit.

16. The device of claim 14, wherein
a voltage of the third node is adjustable.

17. The device of claim 16, wherein
the third node is coupled to a voltage generator.

18. The device of claim 14, wherein
one of a source and drain of the fourth transistor is electrically coupled the bit line, the other of the source and the drain of the fourth transistor is electrically coupled to the first node,
one of a source and drain of the fifth transistor is electrically coupled to the first node, the other of the source and the drain of the fifth transistor is electrically coupled to the second node, and
one of a source and drain of the sixth transistor is electrically coupled to the first node, the other of the source and the drain of the sixth transistor is electrically coupled to the third node.

* * * * *